(12) United States Patent
Bonkohara

(10) Patent No.: US 8,907,459 B2
(45) Date of Patent: Dec. 9, 2014

(54) THREE-DIMENSIONAL SEMICONDUCTOR INTEGRATED CIRCUIT DEVICE AND METHOD OF FABRICATING THE SAME

(75) Inventor: Manabu Bonkohara, Tokyo (JP)

(73) Assignee: Zycube Co., Ltd., Tokyo (JP)

( * ) Notice: Subject to any disclaimer, the term of this patent is extended or adjusted under 35 U.S.C. 154(b) by 1331 days.

(21) Appl. No.: 12/523,118

(22) PCT Filed: Jan. 15, 2007

(86) PCT No.: PCT/JP2007/050447
§ 371 (c)(1),
(2), (4) Date: Jun. 15, 2010

(87) PCT Pub. No.: WO2008/087701
PCT Pub. Date: Jul. 24, 2008

(65) Prior Publication Data
US 2011/0127652 A1 Jun. 2, 2011

(51) Int. Cl.
| | |
|---|---|
| *H01L 23/552* | (2006.01) |
| *H01L 23/31* | (2006.01) |
| *H01L 21/56* | (2006.01) |
| *H01L 25/00* | (2006.01) |
| *H01L 23/00* | (2006.01) |

(52) U.S. Cl.
CPC ..... *H01L 21/561* (2013.01); *H01L 2224/48091* (2013.01); *H01L 2225/06541* (2013.01);
(Continued)

(58) Field of Classification Search
USPC .......... 257/659, 686, 774, E23.001; 438/107, 438/109, 241, 584; 361/760, 784
See application file for complete search history.

(56) References Cited

U.S. PATENT DOCUMENTS

2006/0118965 A1* 6/2006 Matsui ........................ 257/774
2008/0285244 A1* 11/2008 Knickerbocker ............. 361/760

FOREIGN PATENT DOCUMENTS

| JP | 2000-183283 | 6/2000 |
|---|---|---|
| JP | 2001-250913 | 9/2001 |

(Continued)

OTHER PUBLICATIONS

International Search Report issued in corresponding application No. PCT/JP2007/050447, completed May 16, 2007 and mailed May 29, 2007.

(Continued)

*Primary Examiner* — Mark A Laurenzi
(74) *Attorney, Agent, or Firm* — Westerman, Hattori, Daniels & Adrian, LLP

(57) ABSTRACT

A three-dimensional semiconductor integrated circuit device is provided. A first semiconductor chip includes a solid-state circuit and is smaller than a base, and is stacked on the base. The first chip is buried by a first filling material having approximately the same contour as the base. Buried electrodes that penetrate through the first chip along its thickness direction are formed in the first chip. A second semiconductor chip includes a solid-state circuit and is smaller than the base, and is stacked on the first chip. The second chip is buried by a second filling material having approximately the same contour as the base. Buried electrodes that penetrate through the second chip along its thickness direction are formed in the second chip. The first and second filling materials have processibilities required for forming the buried electrodes and thermal expansion coefficients equivalent to those of the first and second chips, respectively.

20 Claims, 7 Drawing Sheets

(52) U.S. Cl.
CPC ... *H01L 2224/45144* (2013.01); *H01L 23/3135* (2013.01); *H01L 2924/01078* (2013.01); *H01L 23/552* (2013.01); *H01L 2225/06589* (2013.01); *H01L 2225/0651* (2013.01); *H01L 2224/48227* (2013.01); *H01L 2924/01029* (2013.01); *H01L 2924/01079* (2013.01); *H01L 2924/04941* (2013.01); *H01L 2924/15311* (2013.01); *H01L 2924/3025* (2013.01); *H01L 2225/06527* (2013.01); *H01L 2924/01019* (2013.01); *H01L 2225/06513* (2013.01); *H01L 24/48* (2013.01); *H01L 25/50* (2013.01); *H01L 2924/01004* (2013.01); *H01L 2225/06582* (2013.01); *H01L 2225/06586* (2013.01)
USPC ............... 257/659; 257/686; 257/E23.001; 438/107; 438/109; 438/241

(56) References Cited

FOREIGN PATENT DOCUMENTS

| JP | 2005-264746 | * | 5/2005 | ............... H05K 3/46 |
|----|-------------|---|--------|---------------------------|
| JP | 2006-216691 |   | 8/2006 |                           |
| JP | 2007-73826  |   | 3/2007 |                           |

OTHER PUBLICATIONS

"What is Polysilicon?," at http://www.aepolysilicon.com/Solar-Education/Polysilicon/ (downloaded Aug. 7, 2013).

"Semiconductor Fabrication Technology," at http://www.engr.uky.edu/~ee461g/semi_fab_techno.htm (downloaded Aug. 7, 2013).

* cited by examiner (FIG.4)

THREE-DIMENSIONAL SEMICONDUCTOR INTEGRATED CIRCUIT DEVICE AND METHOD OF FABRICATING THE SAME

This is a National Phase Application in the United States of International Patent Application No. PCT/JP2007/050447 filed Jan. 15, 2007, the entire disclosure of which is hereby incorporated by reference.

TECHNICAL FIELD

The present invention relates to a three-dimensional semiconductor integrated circuit device suitable for higher integration and higher densification and a method of fabricating the same.

BACKGROUND ART

In connection with the recent miniaturization and high-functionalization of the electronic equipment, higher integration and higher densification have been required for the semiconductor integrated circuit devices to be mounted on the electronic equipment also.

To meet such the requirement as above, three-dimensional semiconductor integrated circuit devices, each of which comprises a plurality of circuit function blocks (solid-state circuits) integrated three-dimensionally, have been developed and as a result, a lot of propositions about their structure and fabrication method have been made (See Patent Literature 1).

FIG. 10 is an explanatory view showing an example of the structure of a conventional three-dimensional semiconductor integrated circuit device. This three-dimensional semiconductor integrated circuit device 300 comprises a plate-shaped base (support substrate) 370 having a solid-state circuit 371 formed in the surface region (the upper surface region in FIG. 10) thereof, and a semiconductor chip 373 having solid-state circuits 372 formed in the surface region thereof, where the chip 373 is stacked on the base 370. The semiconductor chip 373 forming a first circuit layer is reversed and as a result, the solid-state circuits 372 of the chip 373, which are located on the surface side of the chip 373, are placed at a lower position (on the side of the base 370). The solid-state circuits 372 are opposed to the solid-state circuit 371 of the base 370. Moreover, the solid-state circuits 372 are electrically connected to the solid-state circuit 371 of the base 370 by way of microbumps 381 provided on the surface (the lower surface in FIG. 10) of the chip 373. These microbumps 381 are electrically insulated from each other with non-illustrated insulating materials, respectively.

The outside shape of the semiconductor chip 373 is the same as that of the base 370. Namely, the thickness (height) of the chip 373 is different from that of the base 373 while the contour of the chips 373 is the same as that of the base 370, where the chip 373 and the base 370 are superposed on each other.

Buried electrodes 374 are formed in the semiconductor chip 373. One end of each electrode 374 is extended to the solid-state circuit 372 and connected thereto, and the other end thereof is extended to the back (the upper surface in FIG. 10) of the chip 373 and exposed. Namely, each electrode 374 penetrates through the chip 373 from the bottom of the solid-state circuit 372 to the back of the chip 373. Each electrode 374 is electrically insulated from the chip 373 with an insulating film 374a that surrounds the whole side face of the electrode 374.

On the back of the semiconductor chip 373, a semiconductor chip 376 having a solid-state circuit 375 formed in the surface region thereof is stacked. The semiconductor chip 376 forming a second circuit layer is reversed and as a result, the solid-state circuits 375 of the chip 376, which are located on the surface side of the chip 376, are placed at a lower position (on the side of the base 370). The solid-state circuits 375 are opposed to the back of the semiconductor chip 373 forming the first circuit layer. Moreover, the solid-state circuits 375 are electrically connected to the solid-state circuits 372 of the chip 373 by way of microbumps 382 provided on the surface (the lower surface in FIG. 10) of the chip 376 and the buried electrodes 374 provided in the chip 373. These microbumps 382 are electrically insulated from each other with non-illustrated insulating materials, respectively.

The outside shape of the semiconductor chip 376 is the same as those of the base 370 and the semiconductor chip 373. Namely, the thickness (height) of the chip 376 is different from those of the base 373 and the chip 373 while the contour of the chip 373 is the same as that of the base 370, where the chips 373 and 376 and the base 370 are superposed on each other. The thickness (height) of the chip 376 may be the same as that of the chip 373.

Buried electrodes 377 are formed in the semiconductor chip 376. One end of each electrode 377 is extended to the solid-state circuit 375 and connected thereto, and the other end thereof is extended to the back (the upper surface in FIG. 10) of the chip 376 and exposed. Namely, each electrode 377 penetrates through the chip 376 from the bottom of the solid-state circuit 375 to the back of the chip 376. Each electrode 377 is electrically insulated from the chip 376 with an insulating film 377a that surrounds the whole side face of the electrode 377.

A non-illustrated external electrode (e.g., a microbump or solder ball) is connected to the exposed end of each buried electrode 376 from the back of the semiconductor chip 376. The conventional three-dimensional semiconductor integrated circuit device 300 is electrically connected to an external circuit by way of these external electrodes.

Each of the solid-state circuits 371, 372, and 375 is, for example, an integrated circuit constituted by the combination of the circuit elements, such as transistors, solid-state devices, and so on formed in the active regions of the base 370 or the semiconductor chip 373 or 376, realizing a predetermined circuit function.

As the stacking type of the respective circuit layers in the aforementioned conventional three-dimensional semiconductor integrated circuit device 300, the "wafer stacking method" where wafers are successively stacked on a base and thereafter, the stacked wafers are divided into pieces, and the "chip stacking method" where semiconductor chips judged good are stacked, have ever been known.

With the "wafer stacking method", a first wafer in which many solid-state circuits (integrated circuits) are embedded is coupled with a base in such a way that the functional elements of the first wafer are opposed to the base. Thereafter, holes are formed in the first wafer from the back side thereof by, for example, etching, and then, these holes are filled with a conductive material, thereby forming buried electrodes that extend from the solid-state circuits to the back of the first wafer. These buried electrodes serve as the electric paths for electrical connection to the aforementioned solid-state circuits. Subsequently, the same processes as those performed for the first wafer are carried out for a second wafer in which many solid-state circuits are embedded. Thereafter, the same processes are repeated, thereby forming a wafer stack that includes the base and the wafers stacked thereon. With this wafer stack, the solid-state circuits existing in the adjoining wafers are electrically interconnected to each other by way of the buried electrodes formed in the wafers. Finally, the wafer stack is diced by, for example, the blade dicing method, according to the necessity, resulting in a wafer-level three-dimensional semiconductor integrated circuit device or chip-shaped three-dimensional semiconductor integrated circuit devices. Any material may be used for the base if it can support wafers to be stacked. In addition, a semiconductor wafer may be used for the base.

Since the formation of the holes and the buried electrodes can be conducted in the wafer level in the "wafer stacking method", the fabrication processes are simplified compared with those in the "chip stacking method". Therefore, the "wafer stacking method" is advantageous at that point.

With the "chip stacking method", usually, holes are formed in a single wafer in which many solid-state circuits are embedded from the back side of the wafer and then, the holes are filled with a conductive material, thereby forming buried electrodes that extend from the solid-state circuits to the back of the wafer. Next, the wafer is diced to pieces, resulting in first semiconductor chips. Thereafter, these first semiconductor chips are subjected to an operation test to sort out good ones. Subsequently, the first semiconductor chips that have been judged good are arranged on the base to have a predetermined layout. Next, second semiconductor chips that have been obtained in the same way as the first semiconductor chips and judged good are stacked on the corresponding first semiconductor chips. The solid-state circuits existing in the first and second semiconductor chips thus stacked are electrically interconnected to each other with the buried electrodes formed therein. After that, these processes are repeated, thereby forming chip stacks each having the semiconductor chips stacked on the base. Finally, the chip stacks are diced by, for example, the blade dicing method, according to the necessity, resulting in a wafer-level three-dimensional semiconductor integrated circuit device or chip-shaped three-dimensional semiconductor integrated circuit devices.

Alternately, the chip stack may be formed by directly stacking a corresponding one of the second semiconductor chips on each of the first semiconductor chips without using the base. In this case, the dicing process is unnecessary.

With the "chip stacking method", the semiconductor chips comprising the electrical paths that have been formed on their surfaces and backs beforehand and that have been judged good are stacked and therefore, the "chip stacking method" is advantageous in fabrication yield compared with the "wafer stacking method".

Patent Literature 1: Japanese Non-Examined Patent Publication No. 2001-250913

DISCLOSURE OF THE INVENTION

Problems to be Solved by the Invention

With the above-described conventional "wafer stacking method", however, the more the total number of the solid-state circuits (integrated circuits) to be stacked, the more the influence of the fabrication yields of the respective solid-state circuits. For this reason, there is a problem that the fabrication yield of the resultant three-dimensional semiconductor integrated circuit device 300 is low. Moreover, there is another problem that wafers having different diameters cannot be stacked on each other.

On the other hand, with the above-described conventional "chip stacking method", the semiconductor chips that have been judged good are stacked and therefore, the fabrication yield lowering that occurs in the "wafer stacking method" can be avoided. However, there is a problem that the sizes of the semiconductor chips to be stacked need to be matched and that stacking of semiconductor chips having different sizes is restricted.

The present invention was created in consideration of these circumstances and its object is to provide a three-dimensional semiconductor integrated circuit device to be fabricated by the chip stacking method that makes it possible to remove the restriction about the dimensions (size) of semiconductor chips to be used, and a fabrication method of the device.

Another object of the present invention is to provide a three-dimensional semiconductor integrated circuit device that makes it possible to realize still higher integration and still higher densification at a high fabrication yield, and a fabrication method of the device.

Other objects not specifically mentioned here will become clear from the following description and drawings attached.

Means for Solving Problems (1) According to the first aspect of the present invention, a three-dimensional semiconductor integrated circuit device is provided. This device comprises:

a base;

a first semiconductor chip stacked on the base, the first semiconductor chip including a first solid-state circuit and being smaller than the base;

a first filling material that buries the first semiconductor chip, the first filling material being formed to have approximately the same outside shape (contour) as the base;

first buried electrodes formed in the first semiconductor chip, the first buried electrodes penetrating through the first semiconductor chip partially or entirely along its thickness direction;

a second semiconductor chip stacked on the first semiconductor chip to be superposed thereon, the second semiconductor chip including a second solid-state circuit and being smaller than the base;

a second filling material that buries the second semiconductor chip, the second filling material being formed to have approximately the same outside shape (contour) as the base; and second buried electrodes formed in the second semiconductor chip, the second buried electrodes penetrating through the second semiconductor chip partially or entirely along its thickness direction;

wherein the first filling material has a processibility required for forming the first buried electrodes equivalent to that of the first semiconductor chip, and a thermal expansion coefficient equivalent to that of the first semiconductor chip;

and wherein the second filling material has a processibility required for forming the second buried electrodes equivalent to that of the second semiconductor chip, and a thermal expansion coefficient equivalent to that of the second semiconductor chip.

(2) With the three-dimensional semiconductor integrated circuit device according to the first aspect of the present invention, the first semiconductor chip stacked on the base has the first solid-state circuit and is smaller than the base. The first semiconductor chip is buried in the first filling material having approximately the same outside shape (contour) as the base. In the first semiconductor chip, the first buried electrodes penetrating through the first semiconductor chip partially or entirely along its thickness direction are formed. The first filling material has a processibility required for forming the first buried electrodes equivalent to that of the first semiconductor chip, and a thermal expansion coefficient equivalent to that of the first semiconductor chip.

Therefore, when the first buried electrodes are formed in the first semiconductor chip, the combination (a first circuit layer) of the first semiconductor chip and the first filling material can be regarded as a single semiconductor chip to thereby set necessary processing conditions. This means that the combination (the first circuit layer) of the first semiconductor chip and the first filling material can be handled as a single semiconductor chip made of the same material entirely.

Similarly, the second semiconductor chip stacked on the first semiconductor chip to be superposed thereon has the second solid-state circuit and is smaller than the base. The second semiconductor chip is buried in the second filling material having approximately the same outside shape (contour) as the base. In the second semiconductor chip, the second buried electrodes penetrating through the second semiconductor chip partially or entirely along its thickness direction are formed. The second filling material has a processibility required for forming the second buried electrodes equivalent to that of the second semiconductor chip, and a thermal expansion coefficient equivalent to that of the second semiconductor chip.

Therefore, when the second buried electrodes are formed in the second semiconductor chip, the combination (a second circuit layer) of the second semiconductor chip and the second filling material can be regarded as a single semiconductor chip to thereby set necessary processing conditions. This means that the combination (the second circuit layer) of the second semiconductor chip and the second filling material can be handled as a single semiconductor chip made of the same material entirely.

With the three-dimensional semiconductor integrated circuit device according to the first aspect of the present invention, because of the above-described reason, the restriction about the dimensions of the first and second semiconductor chips to be used can be removed.

Moreover, because each of the combination (the first circuit layer) of the first semiconductor chip and the first filling material and the combination (the second circuit layer) of the second semiconductor chip and the second filling material can be handled as a single semiconductor chip made of the same material entirely, and the aforementioned restriction is removed, desired semiconductor chips can be easily combined and stacked on the base. Accordingly, still higher integration and still higher densification can be realized and a high fabrication yield can be obtained.

On the other hand, since the first filling material has a thermal expansion coefficient equivalent to that of the first semiconductor chip and the second filling material has a thermal expansion coefficient equivalent to that of the second semiconductor chip, a phenomenon that the first or second semiconductor chip is respectively detached from the first or second filling material at their joint faces due to the thermal expansion coefficient difference will not occur. Therefore, even if the first circuit layer is formed by the first semiconductor chip and the first filling material, and the second circuit layer is formed by the second semiconductor chip and the second filling material, no difficulty will occur.

(3) In a preferred embodiment of the three-dimensional semiconductor integrated circuit device according to the first aspect of the present invention, the base comprises an additional solid-state circuit, wherein the first solid-state circuit of the first semiconductor chip is placed opposite to the additional solid-state circuit.

In another preferred embodiment of the three-dimensional semiconductor integrated circuit device according to the first aspect of the present invention, the first filling material covers a side face of the first semiconductor chip and a surface or a back of the first semiconductor chip, wherein the first semiconductor chip is entirely buried in the first filling material. In this case, the first buried electrodes penetrate not only through the first semiconductor chip partially or entirely along its thickness direction but also through the first filling material that covers the surface or the back of the first semiconductor chip along its thickness direction.

In still another preferred embodiment of the three-dimensional semiconductor integrated circuit device according to the first aspect of the present invention, the first filling material covers a side face of the first semiconductor chip and does not cover a surface or a back of the first semiconductor chip, wherein the surface or the back of the first semiconductor chip is exposed from the first filling material. In this case, the first buried electrodes penetrate only through the first semiconductor chip partially or entirely along its thickness direction.

In a further preferred embodiment of the three-dimensional semiconductor integrated circuit device according to the first aspect of the present invention, the second filling material covers a side face of the second semiconductor chip and a surface or a back of the second semiconductor chip, wherein the second semiconductor chip is entirely buried in the second filling material. In this case, the second buried electrodes penetrate not only through the second semiconductor chip partially or entirely along its thickness direction but also through the second filling material that covers the surface or the back of the second semiconductor chip along its thickness direction.

In a still further preferred embodiment of the three-dimensional semiconductor integrated circuit device according to the first aspect of the present invention, the second filling material covers a side face of the second semiconductor chip and does not cover a surface or a back of the second semiconductor chip, wherein the surface or the back of the second semiconductor chip is exposed from the second filling material. In this case, the second buried electrodes penetrate only through the second semiconductor chip partially or entirely along its thickness direction.

In a still further preferred embodiment of the three-dimensional semiconductor integrated circuit device according to the first aspect of the present invention, third to n-th (n is an integer equal to or greater than 3) semiconductor chips stacked on the second semiconductor chip to be superposed thereon are further provided, the third to n-th semiconductor chips including respectively third to n-th solid-state circuits and being smaller than the base;

third to n-th filling materials that bury respectively the third to n-th semiconductor chips, each of the third to n-th filling materials being formed to have approximately the same outside shape (contour) as the base; and third to n-th buried electrodes formed respectively in the third to n-th semiconductor chips, each of the third to n-th buried electrodes penetrating through one of the third to n-th semiconductor chips partially or entirely along its thickness direction;

wherein the third to n-th filling materials have processibilities required for forming the third to n-th buried electrodes equivalent to those of the third to n-th semiconductor chips, and thermal expansion coefficients equivalent to those of the third to n-th semiconductor chips, respectively.

In a still further preferred embodiment of the three-dimensional semiconductor integrated circuit device according to the first aspect of the present invention, the first semiconductor chip and the second semiconductor chip are made of single-crystal silicon, and the first filling material and the second filling material are made of polysilicon.

In a still further preferred embodiment of the three-dimensional semiconductor integrated circuit device according to the first aspect of the present invention, each of the first semiconductor chip and the second semiconductor chip has a SOI structure, and the first filling material and the second filling material are made of silicon oxide.

In a still further preferred embodiment of the three-dimensional semiconductor integrated circuit device according to the first aspect of the present invention, at least one of the first buried electrodes and the second buried electrodes are formed by one selected from Cu, W, Ni, Au, and Al, and their alloys.

In a still further preferred embodiment of the three-dimensional semiconductor integrated circuit device according to the first aspect of the present invention, the first buried electrodes and the second buried electrodes are formed by polysilicon or metal silicon.

In a still further preferred embodiment of the three-dimensional semiconductor integrated circuit device according to the first aspect of the present invention, a substrate on which external electrodes are formed is further provided, wherein the three-dimensional semiconductor integrated circuit device is electrically connected to the substrate by flip chip connection.

In a still further preferred embodiment of the three-dimensional semiconductor integrated circuit device according to the first aspect of the present invention, a substrate on which external electrodes are formed is further provided, wherein the three-dimensional semiconductor integrated circuit device is electrically connected to the substrate with wire bonding.

In a still further preferred embodiment of the three-dimensional semiconductor integrated circuit device according to the first aspect of the present invention, external electrodes are formed on a surface of the second semiconductor chip or another of the semiconductor chips stacked on or over the second semiconductor chip opposite to the base, wherein the three-dimensional semiconductor integrated circuit device is electrically connected to the external electrodes.

In a still further preferred embodiment of the three-dimensional semiconductor integrated circuit device according to the first aspect of the present invention, a heat spreader attached to a surface of the base opposite to the first semiconductor chip is further provided.

In a still further preferred embodiment of the three-dimensional semiconductor integrated circuit device according to the first aspect of the present invention, an electromagnetic shielding material that covers whole side faces of the first filling material and the second filing material is further provided.

(4) In the three-dimensional semiconductor integrated circuit device according to the first aspect of the present invention, the first filling material may cover the surface and the side face of the first semiconductor chip stacked on the base or the back and the side face thereof, or may cover only the side face of the first semiconductor chip. In the latter case, the surface and the side face of the first semiconductor chip are exposed from the first filling material.

Similarly, the second filling material may cover the surface and the side face of the second semiconductor chip stacked on the first semiconductor chip or the back and the side face thereof, or may cover only the side face of the second semiconductor chip. In the latter case, the surface and the side face of the second semiconductor chip are exposed from the second filling material.

The third, fourth, . . . semiconductor chips may be further stacked on the second semiconductor chip to be superposed thereon.

"The first filling material has a processibility required for forming the first buried electrodes equivalent to that of the first semiconductor chip" has a meaning that the processibility of the first filling material and that of the first semiconductor chip in the required processes, such as etching, photolithography, CVD and cleaning, which are used in the formation of the first buried electrodes, are equivalent. Moreover, if it is limited to this point, it means that the combination of the first filling material and the first semiconductor chip can be identified with a member made of a single material, thereby setting up the conditions of these processes. The expression "the second filling material has a processibility required for forming the second buried electrodes equivalent to that of the second semiconductor chip" has a similar meaning to this.

(5) According to the second aspect of the present invention, a method of fabricating a three-dimensional semiconductor integrated circuit device is provided. This method comprises the steps of:

placing first semiconductor chips, each of which includes a first solid-state circuit, on a base to be apart from each other;

forming a first filling material to bury the first semiconductor chips placed on the base and to have approximately the same outside shape (contour) as the base;

forming first buried electrodes in each of the first semiconductor chips buried by the first filling material, the first buried electrodes penetrating through the first semiconductor chip partially or entirely along its thickness direction;

placing second semiconductor chips, each of which includes a second solid-state circuit, to be apart from each other and to be superposed on the corresponding first semiconductor chips;

forming a second filling material to bury the second semiconductor chips stacked on the corresponding first semiconductor chips and to have approximately the same outside shape (contour) as the base;

forming second buried electrodes in each of the second semiconductor chips buried by the second filling material, the second buried electrodes penetrating through the second semiconductor chip partially or entirely along its thickness direction; and cutting a stacked structure including the first semiconductor chips and the second semiconductor chips formed on or over the base along with the base, thereby forming chip stacks separated, each of the chip stacks including the first semiconductor chip and the second semiconductor chip;

wherein the first filling material has a processibility required for forming the first buried electrodes equivalent to those of the first semiconductor chips, and a thermal expansion coefficient equivalent to those of the first semiconductor chips;

and wherein the second filling material has a processibility required for forming the second buried electrodes equivalent to those of the second semiconductor chips, and a thermal expansion coefficient equivalent to those of the second semiconductor chips.

(6) With the method of fabricating a three-dimensional semiconductor integrated circuit device according to the second aspect of the present invention, the chip stacks each of which includes the first semiconductor chip and the second semiconductor chip, i.e., three-dimensional semiconductor integrated circuit devices, are obtained through the above-described steps; therefore, a plurality of three-dimensional semiconductor integrated circuit devices are obtained in a lump.

Moreover, the first filling material has a processibility required for forming the first buried electrodes equivalent to those of the first semiconductor chips, and a thermal expansion coefficient equivalent to those of the first semiconductor chips, and the second filling material has a processibility required for forming the second buried electrodes equivalent to those of the second semiconductor chips, and a thermal expansion coefficient equivalent to those that of the second semiconductor chips.

Therefore, in the step of forming the first buried electrodes in each of the first semiconductor chips and the step of forming the second buried electrodes in each of the second semiconductor chips, necessary processing conditions can be set while the combination (a first circuit layer) of the first semiconductor chips and the first filling material or the combination (a second circuit layer) of the second semiconductor chips and the second filling material is regarded as a single semiconductor chip.

Accordingly, the restriction about the dimensions of the first semiconductor chips and the second semiconductor chips to be used can be removed.

Furthermore, each of the combination (the first circuit layer) of the first semiconductor chips and the first filling material and the combination (the second circuit layer) of the second semiconductor chips and the second filling material can be handled in a similar manner as that for a single semiconductor chip made of the same material entirely, and in addition, the aforementioned restriction is eliminated. Therefore, desired semiconductor chips can be easily combined and stacked on the base. Accordingly, still higher integration and still higher densification can be realized and a high fabrication yield can be obtained.

(7) In a preferred embodiment of the method of fabricating a three-dimensional semiconductor integrated circuit device according to the second aspect of the present invention, the first filling material is formed to cover side faces of the first semiconductor chips and surfaces or backs of the first semiconductor chips, wherein the first semiconductor chips are entirely buried in the first filling material. The first buried electrodes are formed to penetrate not only through the first semiconductor chips partially or entirely along their thickness direction but also through the first filling material that covers the surfaces or the backs of the first semiconductor chips along their thickness direction.

In another preferred embodiment of the method of fabricating a three-dimensional semiconductor integrated circuit device according to the second aspect of the present invention, the first filling material is formed to cover side faces of the first semiconductor chips and not to cover surfaces or backs of the first semiconductor chips, wherein the surfaces or the backs of the first semiconductor chips are exposed from the first filling material. The first buried electrodes are formed to penetrate through the first semiconductor chips partially or entirely along their thickness direction.

In still another preferred embodiment of the method of fabricating a three-dimensional semiconductor integrated circuit device according to the second aspect of the present invention, the second filling material is formed to cover side faces of the second semiconductor chips and surfaces or backs of the second semiconductor chips, wherein the second semiconductor chips are entirely buried in the second filling material. The second buried electrodes are formed to penetrate not only through the second semiconductor chips partially or entirely along their thickness direction but also through the second filling material that covers the surfaces or the backs of the second semiconductor chips along their thickness direction.

In a further preferred embodiment of the method of fabricating a three-dimensional semiconductor integrated circuit device according to the second aspect of the present invention, the second filling material is formed to cover side faces of the second semiconductor chips and not to cover surfaces or backs of the second semiconductor chips, wherein the surfaces or the backs of the second semiconductor chips are exposed from the second filling material. The second buried electrodes are formed to penetrate through the second semiconductor chips partially or entirely along their thickness direction.

In a further preferred embodiment of the method of fabricating a three-dimensional semiconductor integrated circuit device according to the second aspect of the present invention, there are additionally provided with the steps of;

stacking third to n-th (n is an integer equal to or greater than 3) semiconductor chips to be superposed on or over the second semiconductor chips, the third to n-th semiconductor chips including respectively third to n-th solid-state circuits and being smaller than the base;

forming third to n-th filling materials to bury respectively the third to n-th semiconductor chips and to have approximately the same outside shape (contour) as the base; and forming third to n-th buried electrodes respectively in the third to n-th semiconductor chips, the third to n-th buried electrodes penetrating respectively through the third to n-th semiconductor chips partially or entirely along their thickness direction;

wherein the third to n-th filling materials have processibilities required for forming the third to n-th buried electrodes equivalent to those of the third to n-th semiconductor chips, and thermal expansion coefficients equivalent to those of the third to n-th semiconductor chips, respectively.

In a further preferred embodiment of the method of fabricating a three-dimensional semiconductor integrated circuit device according to the second aspect of the present invention, semiconductor chips made of single-crystal silicon are used as the first semiconductor chips and the second semiconductor chips, and polysilicon is used as the first filling material and the second filling material.

In a further preferred embodiment of the method of fabricating a three-dimensional semiconductor integrated circuit device according to the second aspect of the present invention, semiconductor chips having a SOI structure are used as the first semiconductor chips and the second semiconductor chips, and silicon oxide is used as the first filling material and the second filling material.

In a further preferred embodiment of the method of fabricating a three-dimensional semiconductor integrated circuit device according to the second aspect of the present invention, at least one of the first buried electrodes and the second buried electrodes are formed by one selected from Cu, W, Ni, Au, and Al, and their alloys.

In a further preferred embodiment of the method of fabricating a three-dimensional semiconductor integrated circuit device according to the second aspect of the present invention, the first buried electrodes and the second buried electrodes are formed by polysilicon or metal silicon.

(8) In the method of fabricating a three-dimensional semiconductor integrated circuit device according to the second aspect of the present invention, the expression "the first filling material has a processibility required for forming the first buried electrodes equivalent to those of the first semiconductor chips" and the expression "the second filling material has a processibility required for forming the second buried electrodes equivalent to those of the second semiconductor chips" have the same meanings as described in the three-dimensional semiconductor integrated circuit device according to the first aspect of the present invention, respectively.

Effects of the Invention

With the three-dimensional semiconductor integrated circuit device according to the first aspect of the present invention and the method of fabricating the device according to the second aspect of the present invention, the restriction about the dimensions (size) of semiconductor chips to be used can be removed in the three-dimensional semiconductor integrated circuit device fabricated by the chip staking method. Moreover, still higher integration and still higher densification can be made possible at a high fabrication yield.

Figure 1:
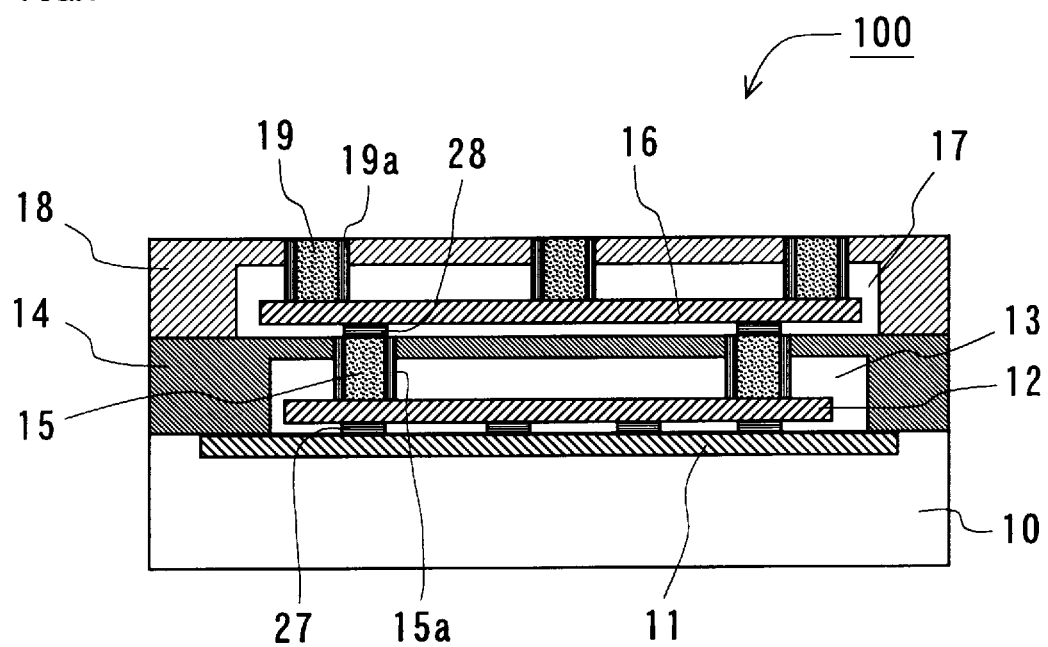
FIG. 1 is a cross-sectional view showing the schematic structure of a three-dimensional semiconductor integrated circuit device according to a first embodiment of the present invention.
Figure 2:
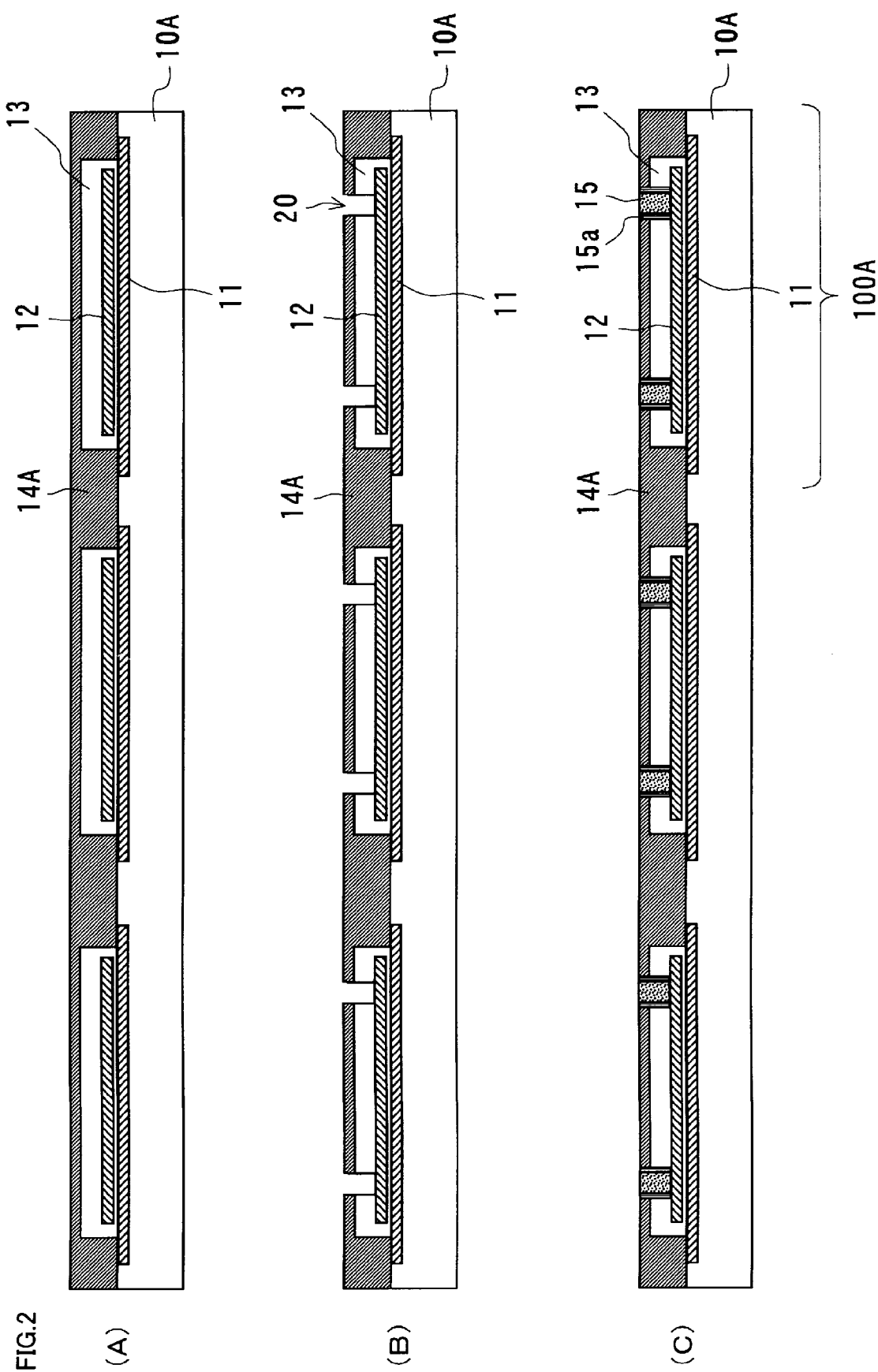
FIGS. 2(A) to 2(C) are cross-sectional views showing the process steps of a method of fabricating the three-dimensional semiconductor integrated circuit device according to the first embodiment of the present invention, respectively.
Figure 3:
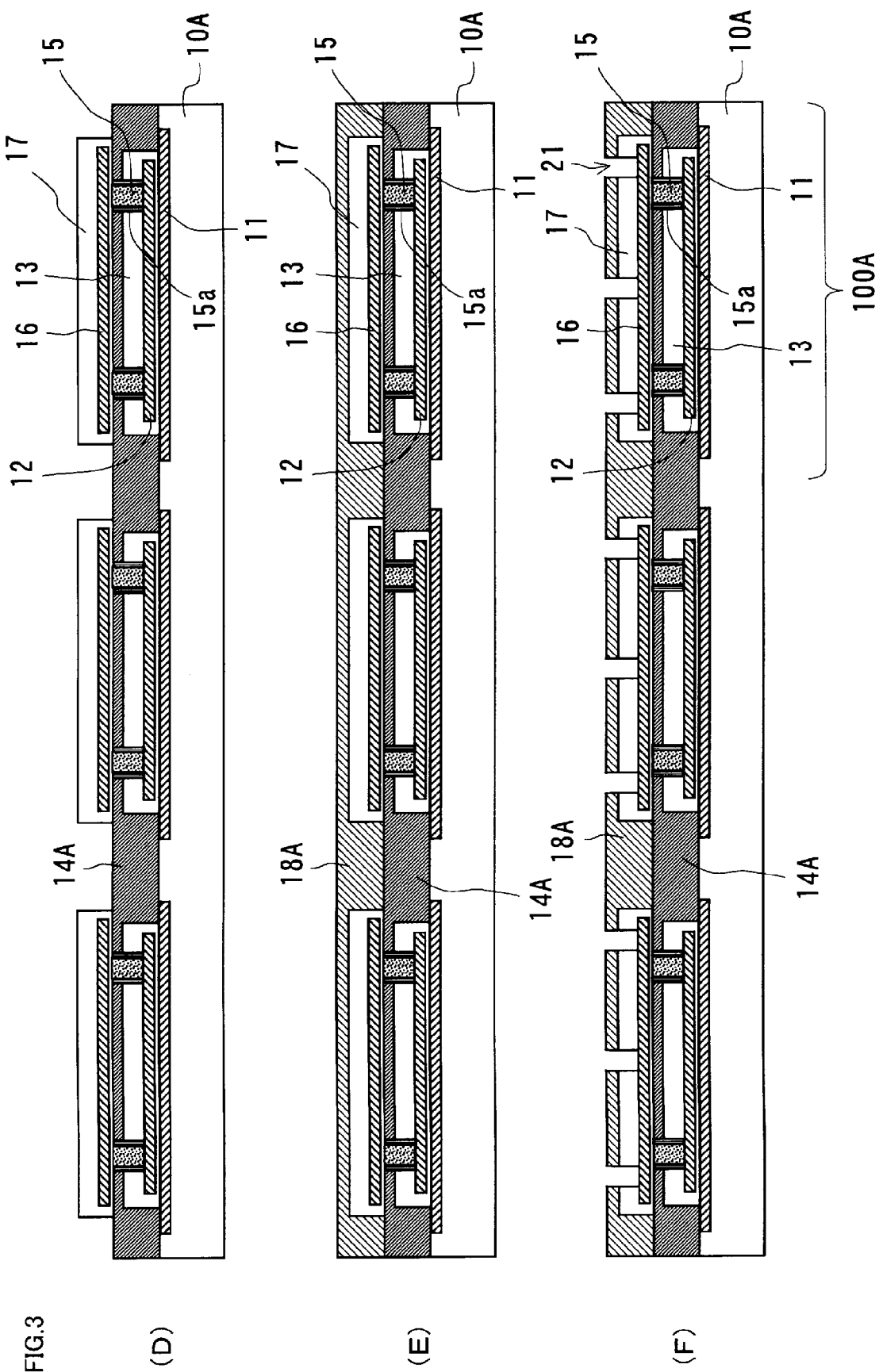
FIGS. 3(D) to 3(F) are cross-sectional views showing the process steps of the method of fabricating the three-dimensional semiconductor integrated circuit device according to the first embodiment of the present invention, respectively, which are subsequent to FIG. 2(C).
Figure 4:
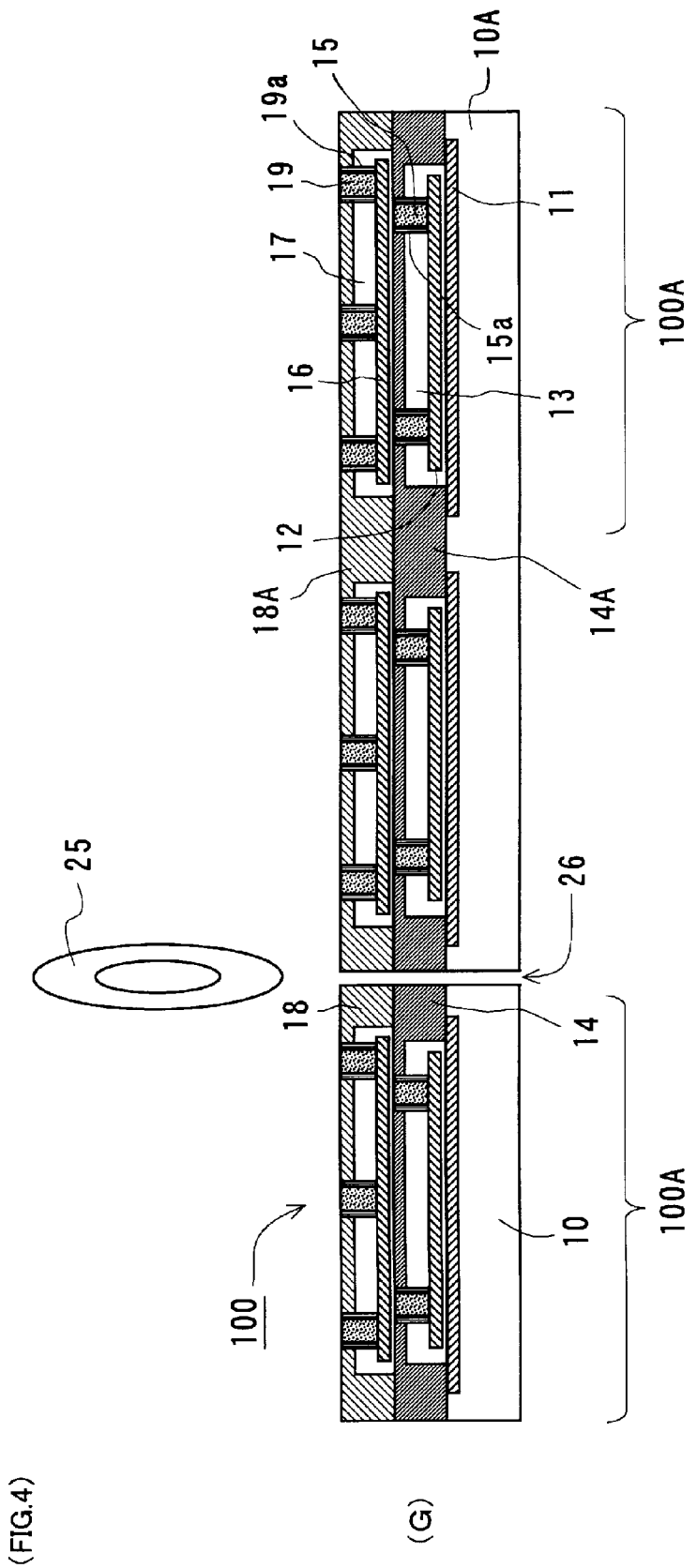
FIG. 4(G) is a cross-sectional view showing the process step of the method of fabricating the three-dimensional semiconductor integrated circuit device according to the first embodiment of the present invention, which is subsequent to FIG. 3(F).

DESCRIPTION OF THE REFERENCE SYMBOLS 10, 10A base
11 solid-state circuit
12 solid-state circuit
13 semiconductor chip
14, 14A first filling material
15 buried electrode
15a insulating film
16, 16' solid-state circuit
17, 17' semiconductor chip
18 second filling material
18' third filling material
19, 19' buried electrode
19a, 19a' insulating film
20 penetrating hole
21 penetrating hole
25 blade
26 cutting portion
27 microbump
28, 28' microbump
31 substrate
32 microbump
33 solder ball
41 substrate
42 molding resin
43 bonding wire
44 solder ball
51 re-wiring layer
52 insulating film
53 copper post
54 solder ball
61 heat spreader
62 electromagnetic shielding material
63 low dielectric constant film
71 insulating film
72 insulating film
100, 110 three-dimensional semiconductor integrated circuit device
100A integrated circuit region
200, 210, 220 packaged three-dimensional semiconductor integrated circuit device
230 three-dimensional semiconductor integrated circuit device with a heat spreader

BEST MODE FOR CARRYING OUT THE INVENTION

Embodiments of the present invention will be described below while referring to the drawings attached, where the same reference symbols are attached to the same positions in each of the drawings and redundant explanations are omitted.

Structure of First Embodiment

FIG. 1 is a cross-sectional view showing the schematic structure of a three-dimensional semiconductor integrated circuit device according to a first embodiment of the present invention. Here, a three-dimensional semiconductor integrated circuit device 100 structured by stacking two semiconductor chips (circuit layers) on a base will be explained as an example.

As shown in FIG. 1, the three-dimensional semiconductor integrated circuit device 100 according to the first embodiment comprises a plate-shaped base (support substrate) 10, a semiconductor chip 13 stacked on the base 10, and a semiconductor chip 17 stacked on the chip 13. The plan shapes (e.g., rectangular) of the semiconductor chips 13 and 17 are the same as that of the base 10. Both of the semiconductor chips 13 and 17 are made of single-crystal silicon (Si).

A solid-state circuit 11 is formed in the surface region (the top face region in FIG. 1) of the base 10. A solid-state circuit 12 is formed in the surface region of the semiconductor chip 13. The top and bottom (surface and back) of the chip 13 are inverted, and the solid-state circuit 12 placed on the surface side of the chip 13 is positioned below, where this solid-state circuit 12 is opposed to the solid-state circuit 11 of the base 10. This solid-state circuit 12 is electrically connected to the solid-state circuit 11 of the base 10 with microbumps 27 provided in the surface region (the bottom face region in FIG. 1) of the chip 13. The respective microbumps 27 are electrically insulated from each other with an unillustrated insulating material.

The semiconductor chip 13 is smaller than the base 10 and covered with a first filling material 14. In other words, the entirety of the chip 13 is buried in the inside of the material 14. The outside shape of the material 14 is equalized to the outside shape of the base 10. Specifically, the thickness of the chip 13 is different from that of the base 10; however, the contour of the chip 13 (e.g., rectangular contour) is the same as that of the base 10, and the chip 13 and the base 10 are superposed on each other. In the outside area of the chip 13 (the non-overlapping region with the chip 13), the surface of the base 10 is exposed, and the peripheral part of the first filling material 14 is placed on the exposed surface of the base 10. The chip 13 and the first filling material 14 covering the chip 13 are formed to be like a flat layer having the same plan shape as that of the base 10, constituting a "first circuit layer".

Buried electrodes 15 are formed in the inside of the semiconductor chip 13. Ends of these electrodes 15 are extended to the solid state circuit 12 and connected thereto; the other ends thereof are extended to the back (the top face in FIG. 1) of the chip 13 and exposed. This means that each of the buried electrodes 15 penetrates through the chip 13 from the bottom of the circuit 12 to the back of the chip 13. Each of the buried electrodes 15 is electrically insulated from the chip 13 and the first filling material 14 by an insulating film 15a that surrounds the whole periphery of the electrode 15.

A solid state circuit 16 is formed in the surface region of the semiconductor chip 17. The surface and back of the chip 17 are inverted, and the solid-state circuit 16 placed on the surface side of the chip 17 is positioned below, where this solid-state circuit 16 is opposed to the back of the semiconductor chip 13. This solid-state circuit 16 is electrically connected to the solid-state circuit 12 of the chip 17 with microbumps 28 provided in the surface region (the bottom face region in FIG. 1) of the chip 17 and the buried electrodes 15 provided in the chip 13. The respective microbumps 28 are electrically insulated from the chip 17 with an unillustrated insulating material.

Similar to the semiconductor chip 13, the semiconductor chip 17 also is smaller than the base 10 and is covered with a second filling material 18. In other words, the entirety of the chip 17 is buried in the inside of the material 18. The outside shape of the material 18 is also equalized to the outside shape of the base 10. Specifically, the thickness of the chip 17 is different from that of the base 10; however, the contour of the chip 17 (e.g., rectangular contour) is the same as that of the base 10, and the chip 17 and the base 10 are superposed on each other. In the outside area of the chip 17 (the non-overlapping region with the chip 13), the surface of the first filling material 14 is exposed, and the peripheral part of the second filling material 18 is placed on the exposed surface of the material 14. The chip 17 and the second filling material 18 covering the chip 17 are formed to be like a flat layer having the same plan shape as that of the base 10, constituting a "second circuit layer".

Buried electrodes 19 are formed in the inside of the semiconductor chip 17. Ends of these electrodes 19 are extended to the solid state circuit 16 and connected thereto; the other ends thereof are extended to the back (the top face in FIG. 1) of the chip 17 and exposed. This means that each of the buried electrodes 19 penetrates through the chip 17 from the bottom of the circuit 16 to the back of the chip 17. Each of the buried electrodes 19 is electrically insulated from the chip 17 and the second filling material 18 by an insulating film 19a that surrounds the whole periphery of the electrode 19.

Here, the semiconductor chip 17 is slightly larger than the semiconductor chip 13; however, the chip 17 may be smaller than the chip 13 or may be the same as the chip 13. Moreover, the thicknesses of the chips 13 and 17 are optional; these thicknesses may be the same or different from each other. The relationship of the thicknesses of the chips 13 and 17 with the thickness of the base 10 is also optional.

To the end of each buried electrode 19 exposed from the back of the semiconductor chip 17, an unillustrated external electrode (e.g., a microbump or solder ball) is connected directly or by way of a re-wiring film (not shown). The three-dimensional semiconductor integrated circuit device 100 according to the first embodiment is electrically connected to an external circuit by way of these external electrodes.

Each of the solid-state circuit 11, 12, and 16 is constituted by the combination of circuit elements, such as transistors and solid-state devices, formed in the active regions of the base 10 or the semiconductor chip 13 or 17, and wiring lines for connecting them, realizing a predetermined circuit function.

As described above, it may be said that the three-dimensional semiconductor integrated circuit device 100 according to the first embodiment of the present invention is constituted by stacking the first circuit layer composed of the semiconductor chip 13 and the second filling material 14 and the second circuit layer composed of the semiconductor chip 17 and the second filling material 18 on the base 10 in this order.

Here, since the semiconductor chips 13 and 17 are made of single-crystal silicon, polysilicon which is a material having a processibility and a thermal expansion property equivalent to those of single-crystal silicon is used as the first filling material 14 and the second filling material 18. The "processibility" used here has a meaning of processibility when forming holes for buried electrode formation. In other words, regarding the first filling material 14 and the semiconductor chip 13, for example, (a) an etching easiness property when the first filling material 14 and the semiconductor chip 13 are etched to form the holes, (b) a deposition property of insulating films when the insulating films 15a are formed on the inner side faces of these holes, and (c) a deposition property when a conductive material is deposited into these holes to form the buried electrodes 15.

Regarding the second filling material 18 and the semiconductor chip 17, for example, (d) an etching easiness property when the second filling material 18 and the semiconductor chip 17 are etched to form the holes, (e) a deposition property of insulating films when the insulating films 19a are formed on the inner side faces of these holes, and (f) a deposition property when a conductive material is deposited into these holes to form the buried electrodes 19.

It is not always necessary for the base 10 to include the solid-state circuit 11. For example, a wafer in which no solid state circuit is formed, like a dummy wafer, may be used as the base 10. In this case, the solid-state circuit 12 of the first semiconductor chip 13 is simply connected mechanically to the base 10 at a predetermined position and is not connected electrically to the base 10. Moreover, the material of the base 10 is optional if it can support the first and second circuit layers.

It is preferred to use a chip that has been judged fully working and good, which is so-called KGD (Known Good Die), as each of the semiconductor chips 13 and 17.

As described above, each of the semiconductor chips 13 and 17 is usually formed by using a bulk silicon substrate. However, it may be formed by using a SOI (Silicon On Insulator) substrate which is a semiconductor substrate comprising a thin single-crystal silicon layer formed on an insulating film. When each of the chips 13 and 17 is formed by using a SOI substrate, it is preferred to use silicon dioxide ($SiO_2$) generated by CVD (Chemical Vapor Deposition) as the filling materials 14 and 18.

The buried electrodes 15 and 19 may be formed by any conductive material; however, it is preferred that these electrodes are formed by a metallic material, such as copper (Cu), tungsten (W) and nickel (Ni), or a semiconductor material, such as polysilicon and metal silicon.

The microbumps 27 and 28 may be formed by any conductive material, such as W.

The insulating films 15a and 19a may be formed by any insulating material, such as $SiO_2$.

Fabrication Method of First Embodiment

Next, a fabrication method of the three-dimensional semiconductor integrated circuit device 100 having the aforementioned structure will be explained below with reference to FIGS. 2(A) to 4(G).

First, as shown in FIG. 2(A), a base 10A, which serves as a foundation of the three-dimensional semiconductor integrated circuit device 100, is prepared. As the base 10A, an approximately circular wafer made of single-crystal silicon is used. A plurality of solid-state circuits 11 are formed and arranged in the surface region of the base 10A to have a predetermined layout. Since one integrated circuit device region 100A is defined for one of the solid-state circuits 11 on the base 10A, the count of the solid-state circuits 11 (i.e., the count of the integrated circuit device regions 100A) formed on the base 10 becomes large if the base 10A has a large diameter. Therefore, the quantity of the three-dimensional semiconductor integrated circuit devices 100 obtained finally will be large.

Next, the semiconductor chips 13 each having their solid-state circuits 12 in their surface regions are arranged to be opposite to the solid-state circuits 11 of the base 10, respectively, in the state where the tops and bottoms of the chips 13 are inverted. Using the microbumps 27 formed on the surface of each chip 13 and an unillustrated solder or conductive adhesive, mechanical and electrical connection between each semiconductor chip 13 and the solid-state circuit 12 corresponding thereto is carried out. This connection is carried out by well-known flip-chip bonding and therefore, detailed explanation about it is omitted. In addition, the mechanical and electrical connection between the solid-state circuits 11 of the base 10 and the solid-state circuits 12 of the semiconductor chips 13 is determined by the circuit configuration of the three-dimensional semiconductor integrated circuit device 100.

Next, the first filling material 14A is formed on the base 10 by a known method in such a manner to cover entirely the semiconductor chips 13 stacked on the base 10, thereby burying all the chips 13 with the first filling material 14A. This is to make it possible to handle all the chips 13 and the first filling material 14A covering the chips 13 as if they were a single wafer.

Here, since the semiconductor chips 13 are made of single-crystal silicon, polysilicon is used as the first filling material 14A. Polysilicon can be deposited on the base 10 by, for example, the CVD method. When polysilicon is deposited on the base 10 on which the semiconductor chips 13 have been mounted, the whole surface of the base 10 is covered with a film-shaped polysilicon; therefore, the surface of the polysilicon is planarized by, for example, the dry etching or CMP method. At this time, as shown in FIG. 2(A), it is adjusted in such a way that the polysilicon is left on each of the chips 13 to have a predetermined thickness. Moreover, since the polysilicon is deposited on the whole surface of the base 10, the end (outer edge) of the polysilicon, i.e., the first filling material 14A, is equal to the outer edge of the base 10. In other words, the plan shape and the size of the first filling material 14A are in accordance with those of the base 10. The state at this time is shown in FIG. 2(A).

Subsequently, as shown in FIG. 2(B), the first filling material 14A and the respective semiconductor chips 13 are selectively removed by a known method, forming penetrating holes 20. Each of the holes 20 penetrates through the part of the first filling material 14A located on each chip 13 (the part overlapping with each chip 13) and further, extends from the back of the corresponding chip 13 to the bottom of the solid-state circuit 12 thereof. Thus, the bottoms of these solid-state circuits 12 are exposed by way of the holes 20. To form the holes 20, for example, the photolithography and dry etching techniques may be used.

Next, as shown in FIG. 2(C), the entire inner side face of each hole 20 is covered with an insulating film 15a by a known method and thereafter, the inside of each hole 20 is filled with a conductive material by a known method, thereby forming the buried electrode 15. When W is selected as the material of the electrodes 15, a W film is deposited on the first filling material 14A by, for example, the CVD method, and the part of the W film located on the first filling material 14A is selectively removed by the CMP method or the like, thereby leaving the W film in the respective holes 20. Thus, the buried electrodes 15 can be formed. In addition, it is preferred that a $SiO_2$ film formed by the CVD method is used as the insulating film 15a formed on the inner side face of the hole 20. Moreover, it is preferred that a barrier film made of titanium nitride (TiN) is formed on the inner surface of the insulating film 15a.

Following this, as shown in FIG. 3(D), the semiconductor chips 17 on which the solid-state circuits 16 have been formed in their surface regions are arranged on the first filling material 14A while the chips 17 are held in their inverted states, and mechanical and electrical connection between each of the microbumps 28 and a corresponding one of the buried electrodes 15 is carried out using the microbumps 28 formed on the surface of each semiconductor chip 17 and an unillustrated solder or conductive adhesive. This connection is carried out by well-known flip-chip bonding and therefore, detailed explanation about it is omitted. Each of the chips 17 is superposed on a corresponding one of the underlying chips 13 in a one-to-one relationship.

Electrical connection between the solid-state circuit 12 of the semiconductor chip 13 and the solid-state circuit 16 of the semiconductor chip 17 is determined in accordance with the circuit configuration of the three-dimensional semiconductor integrated circuit device 100. The state at this time is shown in FIG. 3(D).

A known re-wiring film (not shown) may be provided between the buried electrodes 15 and the microbumps 28. In this case, there is an advantage that each of the microbumps 28 may be connected mechanically and electrically to one of the buried electrodes 15 located at a non-overlapping position with the microbump 28.

Next, as shown in FIG. 3(E), a second filling material 18A is formed by a known method in such a way as to cover entirely the semiconductor chips 17 placed on the first filling material 14A, thereby burying all the chips 17 with the second filling material 18A. This is to make it possible to handle all the chips 17 and the second filling material 18A covering the chips 17 as if they were a single wafer.

Here, since the semiconductor chips 17 are made of single-crystal silicon, polysilicon is used as the second filling material 18A. Polysilicon can be deposited on the first filling material 14A by, for example, the CVD method. When polysilicon is deposited on the first filling material 14A on which the chips 17 have been mounted, the whole surface of the first filling material 14A is covered with a film-shaped polysilicon; therefore, the surface of the polysilicon is planarized by, for example, the dry etching or CMP method. At this time, as shown in FIG. 3(E), it is adjusted in such a way that the polysilicon is left on each of the chips 17 to have a predetermined thickness. Moreover, since the polysilicon is deposited on the whole surface of the first filling material 14A, the end (outer edge) of the polysilicon, i.e., the second filling material 18A, is equal to the outer edge of the first filling material 14A (and the base 10). In other words, the plan shape and the size of the second filling material 18A are in accordance with those of the first filling material 14A and the base 10. The state at this stage is shown in FIG. 3(E).

Subsequently, as shown in FIG. 3(F), the second filling material 18A and the respective semiconductor chips 17 are selectively removed by a known method, forming penetrating holes 21. Each of the holes 21 penetrates through the part of the second filling material 18A located on each chip 17 (the part overlapping with each chip 17) and further, extends from the back of the corresponding chip 17 to the bottom of the solid-state circuit 16 thereof. Thus, the bottoms of the solid-state circuits 16 are exposed by way of the holes 21. To form the holes 21, for example, the photolithography and dry etching techniques may be used.

Next, as shown in FIG. 4(G), the inner side face of each hole 21 is covered with an insulating film 19a by a known method and thereafter, the inside of each hole 21 is filled with a conductive material by a known method, thereby forming the buried electrodes 19. When W is selected as the material of the electrodes 19, the electrodes 19 may be formed by, for example, the CVD method. In addition, it is preferred that a $SiO_2$ film formed by the CVD method is used as the insulating film 19a formed on the inner side face of the hole 21. Moreover, it is preferred that a barrier film made of TiN is formed on the inner surface of the insulating film 19a. This point is the same as the case of the holes 20.

Through the aforementioned steps, as shown in FIG. 4(G), a plurality of integrated circuit device regions 100A (in other words, three-dimensional semiconductor integrated circuit devices 100 according to the first embodiment) are formed on the base 10A to have a predetermined layout. Therefore, the stack obtained in this way is cut by the known dicing method using, for example a blade 25, thereby dividing the stack into the integrated circuit device regions 100A. The reference numeral 26 denotes a cutting portion.

Due to the cutting and dividing, the bases 10 are obtained from the base 10A, the first filling materials 14 are obtained from the first filling material 14A, and the second filling materials 18 are obtained from the second filling material 18A. As a result, a plurality of the three-dimensional semiconductor integrated circuit devices 100 each having the structure of FIG. 1 according to the first embodiment of the present invention can be obtained simultaneously.

The first and second filling materials 14 and 18 made of polysilicon are exposed from the external side faces of the three-dimensional semiconductor integrated circuit device 100 fabricated in this way. Although the end portions of the semiconductor chips 13 and 17 are kept to be single-crystal silicon, the polysilicon end portions of the first and second filling materials 14 and 18 are kept polycrystalline or turned to be amorphous silicon.

As explained above, with the three-dimensional semiconductor integrated circuit device 100 according to the first embodiment of the present invention, each of the single-crystal silicon semiconductor chips 13 that constitute the first circuit layer is smaller than the base 10, and the periphery (the back and the side faces) of the chip 13 is covered with the polysilicon first filling material 14, as shown in FIG. 1. In other words, the entirety of the chip 13 is buried into the polysilicon first filling material 14 having a processibility equivalent to that of the chip 13 (a processibility in the step relating to the formation of the buried electrodes 15) and a thermal expansion coefficient equivalent to that of the chip 13.

Moreover, each of the single-crystal silicon semiconductor chips 17 that constitute the second circuit layer is smaller than the base 10, and the periphery (the back and the side faces) of the chip 17 is covered with the polysilicon second filling material 18. In other words, the entirety of the chip 17 is buried into the polysilicon second filling material 18 having a processibility equivalent to that of the chip 17 (a processibility in the step relating to the formation of the buried electrodes 19) and a thermal expansion coefficient equivalent to that of the chip 17.

For this reason, when the penetrating holes 20 that penetrate through each semiconductor chip 13 and the first filling material 14 are formed, etching can be performed in the same way as that where the entirety of the first circuit layer is formed by single-crystal silicon. In addition, when the insulating film 15a is formed on the inner side faces of the penetrating holes 20 thus formed, the insulating film 15a can be deposited in the same way was as that the entirety of the first circuit layer is formed by single-crystal silicon. Furthermore, when the conductive material is filled into the inner side of the penetrating holes 20 thus formed thereby forming the buried electrodes 15, the conductive material can be deposited and selectively removed in the same way as that the entirety of the first circuit layer is formed by single-crystal silicon.

Similarly, when the penetrating holes 21 that penetrate through each semiconductor chip 17 and the second filling material 18 are formed, etching can be performed in the same way as that the entirety of the second circuit layer is formed by single-crystal silicon. In addition, when the insulating film 19a is formed on the inner side faces of the penetrating holes 21 thus formed, the insulating film 19a can be deposited in the same way as that the entirety of the second circuit layer is formed by single-crystal silicon. Furthermore, when the conductive material is filled into the inner side faces of the penetrating holes 21 thus formed thereby forming the buried electrodes 19, the conductive material can be deposited and selectively removed in the same way as that the entirety of the second circuit layer is formed by single-crystal silicon.

Accordingly, if the condition that the semiconductor chip 13 is smaller than the base 10 is satisfied, the first circuit layer formed by the semiconductor chips 13 made of single-crystal silicon and the first filling material 14 made of polysilicon that buries the chips 13 can be regarded in the same way as the conventional case where the entire first circuit layer is made of single-crystal silicon, thereby setting necessary processing (treatment) conditions about the formation of the buried electrodes 15. In other words, the first circuit layer formed by the single-crystal silicon semiconductor chips 13 and the polysilicon first filling material 14 can be handled in the same way as the single-crystal silicon semiconductor chip.

Similarly, if the condition that the semiconductor chip 17 is smaller than the base 10 is satisfied, the second circuit layer formed by the semiconductor chips 17 made of single-crystal silicon and the second filling material 18 made of polysilicon that buries the chips 17 can be regarded in the same way as the conventional case where the entire second circuit layer is made of single-crystal silicon, thereby setting necessary processing (treatment) conditions about the formation of the buried electrodes 19. In other words, the second circuit layer formed by the single-crystal silicon semiconductor chips 17 and the polysilicon second filling material 18 can be handled in the same way as the single-crystal silicon semiconductor chip.

Figure 9:
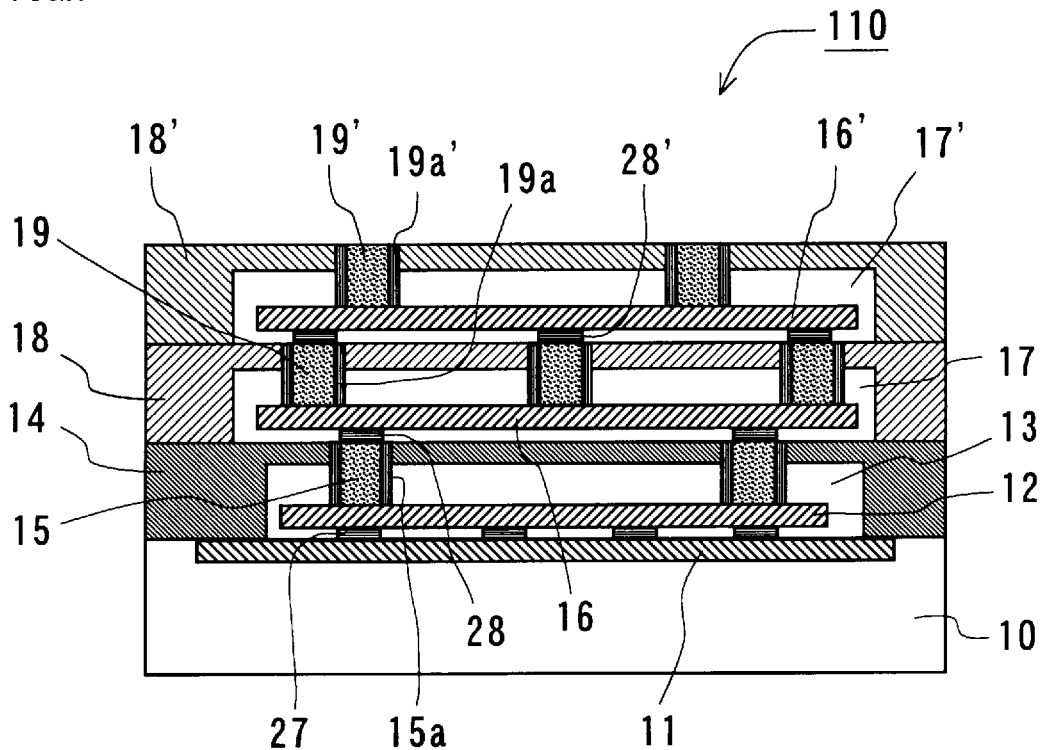
FIG. 9 is a cross-sectional view showing the schematic structure of a three-dimensional semiconductor integrated circuit device according to a sixth embodiment of the present invention, where three semiconductor chips are stacked in the three-dimensional semiconductor integrated circuit device according to the first embodiment of the present invention.
Figure 10:
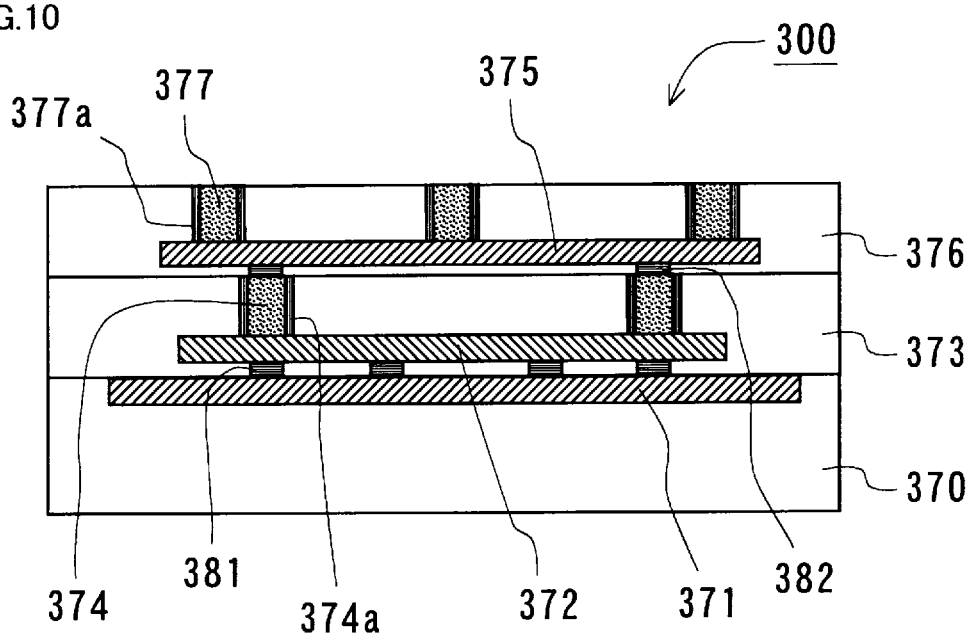
FIG. 10 is a cross-sectional view showing the schematic structure of a conventional three-dimensional semiconductor integrated circuit device.

As a result, irrelevant to the dimensions of the semiconductor chips 13 and 17 that constitute respectively the first and second circuit layers, the conditions for the processes for forming respectively the buried electrodes 15 and 19 in the semiconductor chips 13 and 17 (the conditions necessary for the formation of the buried electrodes 15 or 19) can be set in the same way as the case where the conventional equal-sized semiconductor chips 373 and 376 are used shown in FIG. 9. This means that the restriction about the dimensions of the semiconductor chips 13 and 17 to be used (the requirement for equalizing the semiconductor chips 13 and 17 with each other) is eliminated.

Because of the aforementioned reasons, with the three-dimensional semiconductor integrated circuit device 100 according to the first embodiment of the present invention which is fabricated by the chip-stacking method, there is not only an advantageous effect that the diameter difference of the wafers before dividing these wafers into pieces to form the semiconductor chips 13 and 17 does not cause any difficulty originally, but also an advantageous effect that the semiconductor chips 13 and 17 can be stacked even if these chips 13 and 17 are different in size.

Moreover, since the three-dimensional semiconductor integrated circuit device 100 can be fabricated by the chip-stacking method without the restriction about the dimensions of the chips 13 and 17 to be used, it is easy to stack other semiconductor chips on the semiconductor chips 17 for multiple-layering. Accordingly, the device 100 is suitable for higher integration and higher densification and can be fabricated at a high yield.

In addition, since the single-crystal silicon semiconductor chips 13 and the polysilicon first filling material 14 are approximately equal in thermal expansion coefficient to each other, a phenomenon that the chips 13 and the first filling material 14 are detached from each other at their joint faces due to the thermal expansion coefficient difference will not occur. Similarly, since the single-crystal silicon semiconductor chips 17 and the polysilicon second filling material 18 are approximately equal in thermal expansion coefficient to each other, a phenomenon that the chips 17 and the second filling material 18 are detached from each other at their joint faces due to the thermal expansion coefficient difference will not occur. Therefore, even if each of the circuit layers is formed by the semiconductor chips and the filling material, no difficulty about the operation reliability will occur.

With the method of fabricating the three-dimensional semiconductor integrated circuit device 100 according to the first embodiment of the present invention, as explained above, after the semiconductor chips 13 are arranged on the base 10A to have a predetermined layout, these chips 13 are entirely buried by the first filling material 14A. Furthermore, after the semiconductor chips 17 are arranged on the first filling material 14A to have a predetermined layout, these chips 17 are entirely buried by the second filling material 18A. Then, these are cut and divided into the semiconductor integrated circuit devices 100A by dicing. In this way, the three-dimensional semiconductor integrated circuit devices 100 are fabricated in the wafer-level in a lump. Therefore, the processing condition of the combination of the semiconductor chips 13 and the first filling material 14A can be set regarding the combination as a single semiconductor chip. Accordingly, the penetrating holes 20 and 21 for the buried electrodes can be formed in the wafer level and a high fabrication yield can be obtained.

Second Embodiment

The three-dimensional semiconductor integrated circuit device 100 according to the first embodiment having the aforementioned structure can be sealed or packaged in a various method.

Figure 5:
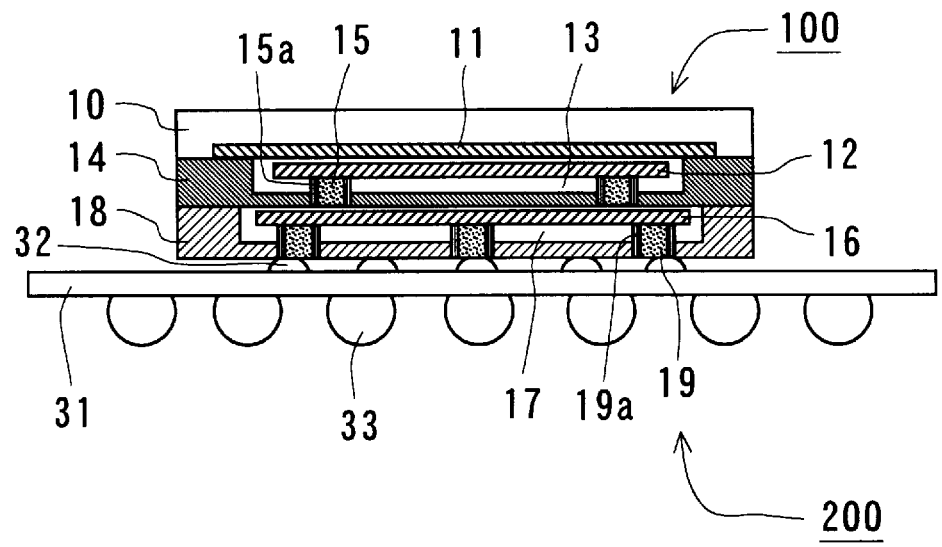
FIG. 5 is a cross-sectional view showing the schematic structure of a three-dimensional semiconductor integrated circuit device according to a second embodiment of the present invention, which is structured by mounting the three-dimensional semiconductor integrated circuit device according to the first embodiment of the present invention on a substrate by flip chip bonding.

FIG. 5 shows a three-dimensional semiconductor integrated circuit device 200 according to a second embodiment of the present invention, which is packaged by flip chip bonding.

The packaged three-dimensional semiconductor integrated circuit device 200 according to the second embodiment is constituted by mounting the three-dimensional semiconductor integrated circuit device 100 according to the first embodiment having the structure of FIG. 1 on a substrate 31, which is slightly larger than the device 100 in its inverted state. The electrical connection between the device 100 and the substrate 31 is performed by flip chip bonding. Specifically, the buried electrodes 19 of the uppermost circuit layer (i.e., the semiconductor chip 17) of the device 100 are mechanically and electrically connected to corresponding microbumps 32 formed on the surface of the substrate 31, respectively. The microbumps 32 may be of any type, for example, solder bumps, gold plated bumps, or gold stud bumps.

Solder balls 33 are formed on the back of the substrate 31 to have a predetermined layout as external electrodes. The solder balls 33 are electrically connected to the corresponding microbumps 32.

Flip chip bonding is suitable for minimizing the interconnection path length.

Third Embodiment

Figure 6:
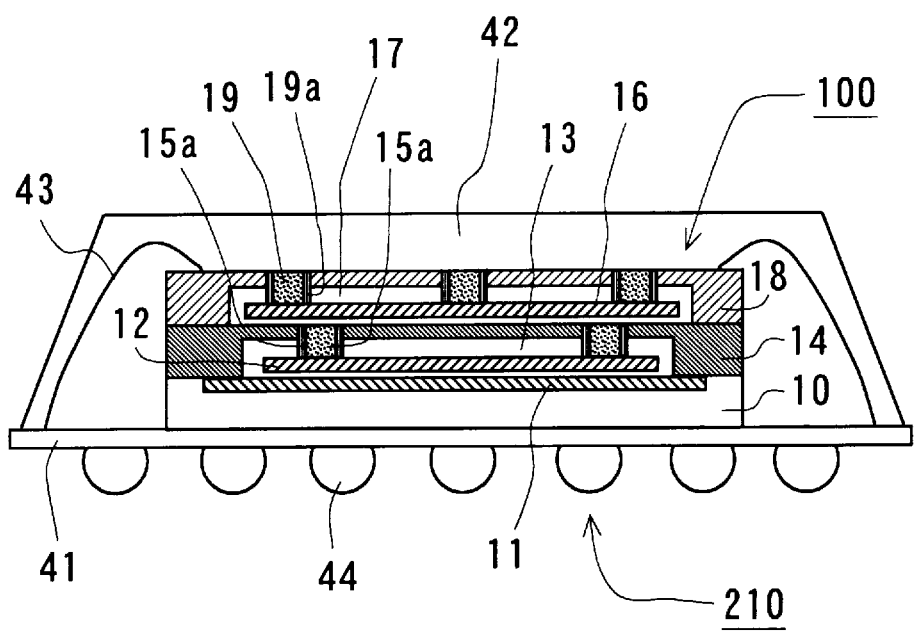
FIG. 6 is a cross-sectional view showing the schematic structure of a three-dimensional semiconductor integrated circuit device according to a third embodiment of the present invention, which is structured by mounting the three-dimensional semiconductor integrated circuit device according to the first embodiment of the present invention on a substrate by wire bonding and sealing them with a resin.

FIG. 6 shows a three-dimensional semiconductor integrated circuit device 210 according to a third embodiment of the present invention, which is sealed in a molding resin by wire bonding.

The three-dimensional semiconductor integrated circuit device 210 according to the third embodiment is constituted by mounting the three-dimensional semiconductor integrated circuit device 100 according to the first embodiment having the structure of FIG. 1 on a substrate 41, which is slightly larger than the device 100 in its non-inverted state. The electrical connection between the device 100 and the substrate 41 is performed by a plurality of bonding wires 43. Specifically, the base 10 of the device 100 is fixed to the surface of the substrate 41 and at the same time, the buried electrodes 19 of the uppermost circuit layer (i.e., the semiconductor chip 17 and the second filling material 18) of the device 100 and wiring lines (not shown) formed on the substrate 41 are electrically interconnected to each other with the bonding wires 43. Since the wiring lines on the substrate 41 are electrically connected to solder balls 44 as external electrodes formed on the back of the substrate 41 to have a predetermined layout, the buried electrodes 19 of the device 100 and the solder balls 44 of the substrate 41 are electrically interconnected by way of the corresponding bonding wires 43. The device 100 and the bonding wires 43 are sealed by an insulating molding resin 42. The dimensions of the resin 42 are approximately the same as those of the substrate 41.

As the bonding wires 43, for example, gold wires are used.

A re-wiring film (not shown) electrically connected to the buried electrodes 19 of the semiconductor chip 17 may be formed on the second filling material 18, and the three-dimensional semiconductor integrated circuit device 100 and the substrate 41 may be electrically connected by way of the re-wiring film and the bonding wires 43. In this case, the re-wiring film also sealed in the molding resin 42.

Fourth Embodiment

Figure 7:
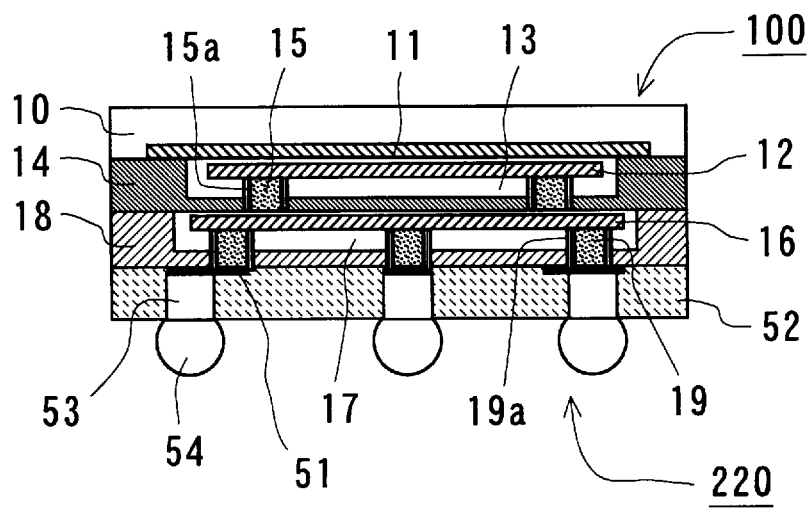
FIG. 7 is a cross-sectional view showing the schematic structure of a three-dimensional semiconductor integrated circuit device according to a fourth embodiment of the present invention, which is structured by packaging the three-dimensional semiconductor integrated circuit device according to the first embodiment of the present invention by W-CSP.

FIG. 7 shows a three-dimensional semiconductor integrated circuit device 220 according to a fourth embodiment of the present invention having a Wafer-level Chip Size Package (W-CSP).

The packaged three-dimensional semiconductor integrated circuit device 220 according to the fourth embodiment is a device whose package is downsized and weight-reduced utilizing the technique of re-wiring on a wafer-shaped base 10A. A package formation step is performed in a lump for the respective integrated circuit device regions 100A on the base 10A before obtaining the three-dimensional semiconductor integrated circuit devices 100 by dividing the integrated circuit device region 100A on the base 10A through dicing.

The packaged device 220 is constituted by forming a patterned re-wiring layer 51, an insulating film 52, copper posts 53, and solder balls 54 serving as external electrodes 54 on the surface (the lower surface in FIG. 7) of the uppermost circuit layer (i.e., the semiconductor chip 17 and the second filling material 18) of the device 100 having the structure of FIG. 1.

The re-wiring layer 51 is contacted with the exposed ends of the respective buried electrodes 19. The insulating film 52 is formed on the surface of the second filling material 18 of the device 100, covering the whole re-wiring layer 51. Each of the copper posts 53 is buried in the insulating film 52 in such a way as to penetrate through the film 52. The base-side end of the post 53 is contacted with the corresponding position of the re-wiring layer 51, and the opposite end of the post 53 to the base 10 is exposed from the insulating film 52. When the device 220 is mounted on a substrate (not shown), the posts 53 serve to relax the stresses occurring between the substrate and the device 220 due to temperature change and shock. Each of the solder balls 54 is fixed to the corresponding exposed end of the copper post 53. In this way, each of the buried electrodes 19 of the device 100 is electrically connected to a corresponding one of the solder balls 54.

The re-wiring layer 51 is formed in the following way. Specifically, first, a ground film is formed on the exposed ends of the buried electrodes 19 which are exposed from the uppermost surface (the lower surface in FIG. 7) of the three-dimensional integrated circuit device 100, i.e., the second filling material 18, by known electroless plating of nickel or gold. Next, for example, an insulating photoresist is coated on the uppermost surface of the device 100 and is exposed to light, forming a mask with a desired pattern. Thereafter, known copper plating is performed on the mask to form a copper film. When the mask is removed in this state, the parts of the copper film placed on the mask are removed along with the mask and only the parts of the copper film not placed on the mask are selectively left, as shown in FIG. 7. The patterned copper film thus obtained will be the re-wiring layer 51.

The insulating film 52 is formed by the known CVD method or the like.

The copper posts 53 are formed by forming penetrating holes at the positions of the insulating film 52 where the respective copper posts 53 are to be formed by known photolithography and etching, and filling the holes with copper by copper plating.

Fifth Embodiment

Figure 8:
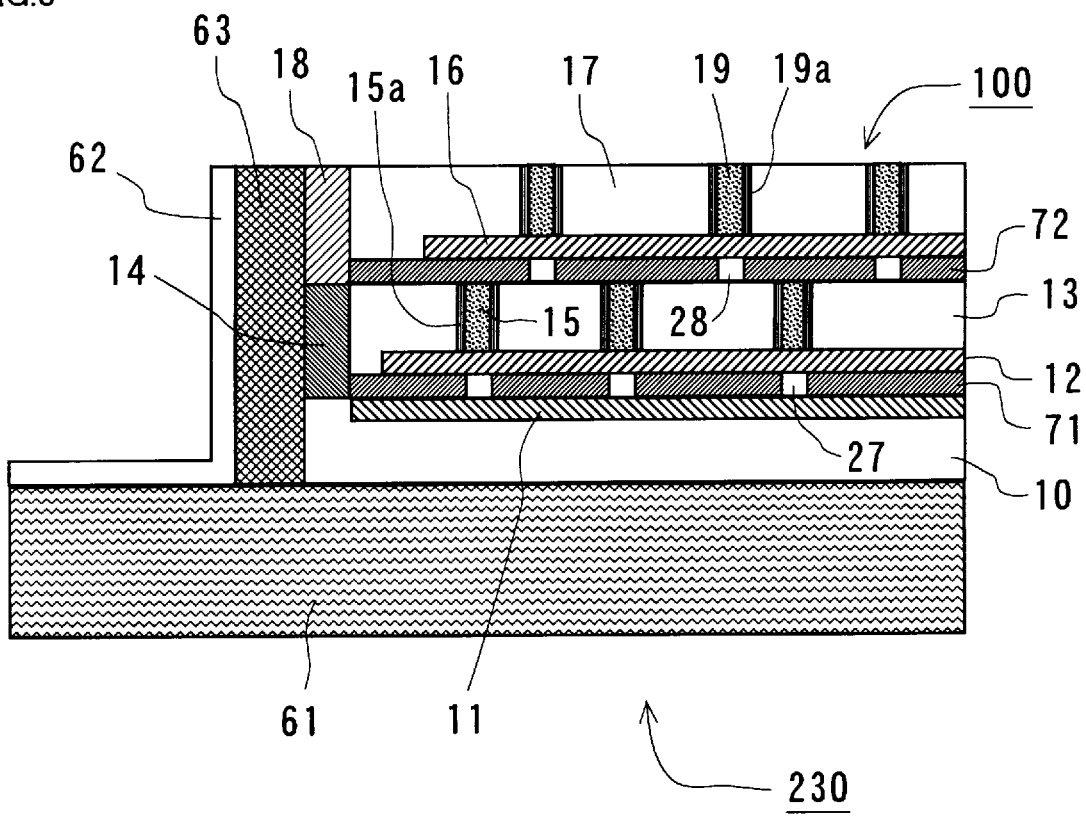
FIG. 8 is a cross-sectional view showing the schematic structure of a three-dimensional semiconductor integrated circuit device according to a fifth embodiment of the present invention, which is structured by attaching a heat spreader and an electromagnetic shielding material to the three-dimensional semiconductor integrated circuit device according to the first embodiment of the present invention.

FIG. 8 shows a three-dimensional semiconductor integrated circuit device 230 according to a fifth embodiment of the present invention. This device 230 is a device whose heat radiating effect and noise margin are enhanced by mounting a heat spreader 61 and an electromagnetic shielding material 62 on the three-dimensional semiconductor integrated circuit device 100 according to the first embodiment having the structure of FIG. 1.

With the three-dimensional semiconductor integrated circuit device 100 shown in FIG. 8, an insulating film 71 covering the surface of the semiconductor chip 13 that constitutes the first circuit layer is shown, where buried electrodes 27 are buried in the insulating film 71. One end of each electrode 27 is electrically connected to the solid-state circuit 11 of the base 10, and the other end thereof is electrically connected to the solid-state circuit 12 of the chip 13. The side faces of the chip 13 and the insulating film 71 are covered with the first filling material 14. Unlike the structure of FIG. 1, the first filling material 14 does not exist on the back (the upper surface in FIG. 8) of the chip 13 and therefore, the back of the chip 13 is exposed.

Moreover, an insulating film 72 covering the surface of the semiconductor chip 17 that constitutes the second circuit layer is also shown, where buried electrodes 28 are buried in the insulating film 72. One end of each electrode 28 is electrically connected to the solid-state circuit 12 by way of the buried electrode 15 of the chip 13, and the other end thereof is electrically connected to the solid-state circuit 16 of the chip 17. The side faces of the chip 17 and the insulating film 72 are covered with the second filling material 18. Unlike the structure of FIG. 1, the second filling material 18 does not exist on the back (the upper surface in FIG. 8) of the chip 17 and therefore, the back of the chip 17 is exposed.

Such the structure that the back of the semiconductor chip 13 is exposed can be easily obtained by selectively removing the part of the first filling material 14 that covers the back of the chip 13 by CMP (Chemical Mechanical Polishing), dry etching, or the like, from the structure that the back of the chip 13 is covered with the first filling material 14, as shown in FIG. 1. At that time, the parts of the buried electrodes 15 and the insulating film 15a existing in the part of the first filling material 14 to be removed are also removed. The buried electrodes 15 and the insulating film 15a may be removed after selectively removing the part of the first filling material 14 that covers the back of the chip 13. The structure that the back of the chip 17 is exposed may be obtained in the same way as the chip 13.

The external surfaces of the first and second filling materials 14 and 18 (the side faces of the three-dimensional semiconductor integrated circuit device 100) are made flat.

To enhance the heat radiation effect by enlarging the heat transfer area, a plate-shaped heat spreader 61 is adhered to the back (the lower surface in FIG. 8) of the three-dimensional semiconductor integrated circuit device 100 shown in FIG. 8. As the heat spreader 61, a thin plate of Al, Cu, Ni or the like may be preferably used. Since the heat spreader 61 is larger than the device 100, the peripheral region of the heat spreader 61 is exposed from the outer edges of the device 100. Therefore, an electromagnetic shielding material 62 is attached to the peripheral region of the heat spreader 61 in such a way as to surround the whole side faces of the device 100. A low dielectric constant film (a low-k film) 63 intervenes between the electromagnetic shielding material 62 and the side faces (the outer surfaces of the first and second filling materials 14 and 18) of the device 100. The electromagnetic shielding material 62 and the low dielectric constant film 63 are in close contact with each other, and the low dielectric constant film 63 and the first and second filling materials 14 and 18 of the device 100 are also in close contact with each other.

The electrical connection between the device 100 and an external circuit is performed by a known method. For example, it is performed using external electrodes or the like provided on the surface (the upper surface in FIG. 8) of the device 100.

With the three-dimensional semiconductor integrated circuit device 230 according to the fifth embodiment of the present invention, the device 230 itself will not produce any noise toward the outside and will not catch any noise from the outside because of the aforementioned mounting structure. Accordingly, there arises an advantageous effect of large noise margin and good operation characteristics in addition to the enhancement of the heat radiation effect.

In addition, the low dielectric constant film 63 may be omitted. In this case, the electromagnetic shielding material 62 and the side faces (the outer surfaces of the first and second filling materials 14 and 18) of the device 100 are in direct constant with each other.

Sixth Embodiment

FIG. 9 is a schematic cross-sectional view of a three-dimensional semiconductor integrated circuit device 110 according to a sixth embodiment of the present invention. This device 110 has the same structure as the three-dimensional semiconductor integrated circuit device 100 according to the first embodiment of the present invention except that three circuit layers (semiconductor chips) are stacked on the base 10.

The first circuit layer constituted by the semiconductor chip 13 and the first filling material 14 and the second circuit layer constituted by the semiconductor chip 17 and the second filling material 18 are substantially the same in structure as the device 100 according to the first embodiment. The third circuit layer stacked on the second circuit layer (the second filling material 18) is substantially the same in structure as the second circuit layer, and is constituted by a semiconductor chip 17' and a third filling material 18'.

A solid state circuit 16' is formed in the surface region of the semiconductor chip 17'. The surface and back of the chip 17' are inverted, and the solid-state circuit 16' located on the surface side of the chip 17' is positioned below. Thus, the solid-state circuit 16' is opposed to the back of the chip 17. The solid-state circuit 16' is electrically connected to a wiring film and external electrodes (not shown) located on the back of the chip 17' with microbumps 28' provided on the surface (the lower surface in FIG. 9) of the chip 17' and the buried electrodes 19' provided in the inside of the chip 17. The respective microbumps 28' are electrically insulated from each other with an unillustrated insulating material.

Similar to the semiconductor chips 13 and 17, the semiconductor chip 17' also is smaller than the base 10 and is covered with a third filling material 18'. In other words, the entirety of the chip 17' is buried in the inside of the material 18'. The outside shape of the material 18' is also equalized to the outside shape of the base 10. Specifically, the thickness of the chip 17' is different from that of the base 10'; however, the contour of the chip 17' (e.g., rectangular contour) is the same as that of the base 10, where the chip 17' and the base 10 are superposed on each other. In the outside area of the chip 17' (the non-overlapping region with the chip 17'), the surface of the second filling material 18 is exposed, and the peripheral part of the third filling material 18' is placed on the exposed surface of the material 18. The chip 17' and the third filling material 18' covering the chip 17' are formed to be like a flat layer having the same plan shape as that of the base 10, constituting the "third circuit layer".

Buried electrodes 19' are formed in the inside of the semiconductor chip 17'. Ends of these electrodes 19' are extended to the solid state circuit 16' and connected thereto; the other ends thereof are extended to the back (the top face in FIG. 9) of the chip 17' and exposed. This means that each of the buried electrodes 19' penetrates through the chip 17' from the bottom of the circuit 16' to the back of the chip 17'. Each of the buried electrodes 19' is electrically insulated from the chip 17' and the third filling material 18' by an insulating film 19a' that surrounds the whole periphery of the electrode 19'.

Here, the semiconductor chip 17' is approximately the same as the semiconductor chip 17; however, the chip 17' may be smaller or larger than the chip 17. Moreover, the thickness of the chip 17' is optional. The relationship between the thickness of the chip 17' and the thickness of the base 10 is also optional.

To the end of each buried electrode 19' exposed from the back of the semiconductor chip 17', an unillustrated external electrode (e.g., a microbump or solder ball) is connected directly or by way of a re-wiring film (not shown). The three-dimensional semiconductor integrated circuit device 110 according to the sixth embodiment is electrically connected to an external circuit by way of these external electrodes.

Variations

Since the above-described first to sixth embodiments are exemplified examples of the present invention, it is needless to say that the present invention is not limited to these embodiments, and any other modification is applicable to these embodiments. For example, two semiconductor chips are stacked to form a two-layer structure in the aforementioned first to fifth embodiments, and three semiconductor chips are stacked to form a three-layer structure in the aforementioned sixth embodiment; however, four or more semiconductor chips may be stacked to form a multilayer structure such as a four-layer structure or five- or more-layer structure.

Furthermore, the orientation (attitude) of a semiconductor chip placed on or over a base is optional. The solid-state circuit in the semiconductor chip may be directed toward the base side so that the solid-state circuit is opposed to the surface of the base; contrarily, the solid-state circuit in the semiconductor chip may be directed toward the opposite side to the base so that the solid-state circuit is opposed to the reverse side of the surface of the base. This is applicable to any other semiconductor chip to be placed on or over the semiconductor chip.

INDUSTRIAL APPLICABILITY

The present invention is applicable to any type of three-dimensional semiconductor integrated circuit device having a three-dimensional stacked structure comprising a plurality of semiconductor chips stacked on a base.

The invention claimed is:

1. A three-dimensional semiconductor integrated circuit device comprising:
 (a) a base;
 (b) a first semiconductor chip stacked on the base, wherein the first semiconductor chip includes a first solid-state circuit and is smaller than the base;
 (c) a first filling material formed on the base to bury the first semiconductor chip, wherein the first filling material is formed to have approximately the same outside shape as the base;
 (d) first buried electrodes formed in the first semiconductor chip, wherein the first buried electrodes penetrate through the first semiconductor chip partially or entirely along a thickness direction of the first semiconductor chip;
 (e) a first circuit layer stacked on the base, wherein the first circuit layer comprises the first semiconductor chip and the first filling material;
 (f) a second semiconductor chip stacked on the first semiconductor chip to be superposed thereon, wherein the second semiconductor chip includes a second solid-state circuit and is smaller than the base;
 (g) a second filling material formed on the first circuit layer to bury the second semiconductor chip, wherein the second filling material is formed to have approximately the same outside shape as the base;
 (h) second buried electrodes formed in the second semiconductor chip, wherein the second buried electrodes penetrate through the second semiconductor chip partially or entirely along a thickness direction of the second semiconductor chip; and
 (i) a second circuit layer stacked on the first circuit layer, wherein the second circuit layer comprises the second semiconductor chip and the second filling material;
 wherein the first filling material has a processibility required for forming the first buried electrodes equivalent to that of the first semiconductor chip and a thermal expansion coefficient equivalent to that of the first semiconductor chip; and
 wherein the second filling material has a processibility required for forming the second buried electrodes equivalent to that of the second semiconductor chip and a thermal expansion coefficient equivalent to that of the second semiconductor chip.

2. The device according to claim 1, wherein the base comprises an additional solid-state circuit, wherein the first solid-state circuit of the first semiconductor chip is placed opposite to the additional solid-state circuit.

3. The device according to claim 1, wherein the first filling material covers a side face of the first semiconductor chip and a surface or a back of the first semiconductor chip, and the first semiconductor chip is entirely buried in the first filling material.

4. The device according to claim 1, wherein the first filling material covers a side face of the first semiconductor chip and does not cover a surface or a back of the first semiconductor chip, and the surface or the back of the first semiconductor chip is exposed from the first filling material.

5. The device according to claim 1, wherein the second filling material covers a side face of the second semiconductor chip and a surface or a back of the second semiconductor chip, and the second semiconductor chip is entirely buried in the second filling material.

6. The device according to claim 1, wherein the second filling material covers a side face of the second semiconductor chip and does not cover a surface or a back of the second semiconductor chip, and the surface or the back of the second semiconductor chip is exposed from the second filling material.

7. The device according to claim 1, further comprising:
 (j) third to n-th semiconductor chips stacked on the second semiconductor chip to be superposed thereon, wherein n is an integer equal to or greater than 3, and wherein the third to n-th semiconductor chips include, respectively, third to n-th solid-state circuits and are smaller than the base;
 (k) third to n-th filling materials that bury respectively the third to n-th semiconductor chips, wherein each of the third to n-th filling materials is formed to have approximately the same outside shape as the base; and
 (l) third to n-th buried electrodes formed respectively in the third to n-th semiconductor chips, wherein each of the third to n-th buried electrodes penetrate through one of the third to n-th semiconductor chips partially or entirely along the thickness direction;
 wherein the third to n-th filling materials have processibilities required for forming the third to n-th buried electrodes equivalent to those of the third to n-th semiconductor chips, and thermal expansion coefficients equivalent to those of the third to nth semiconductor chips, respectively.

8. The device according to claim 1, wherein the first semiconductor chip and the second semiconductor chip are made of single-crystal silicon, and the first filling material and the second filling material include polysilicon.

9. The device according to claim 1, wherein each of the first semiconductor chip and the second semiconductor chip has a Silicon On Insulator structure, and the first filling material and the second filling material are made of silicon oxide.

10. The device according to claim 1, wherein at least one of the first buried electrodes and the second buried electrodes are formed by an element selected from the group consisting of Cu, W, Ni, Au, and Al, and alloys of the selected element.

11. The device according to claim 1, wherein the first buried electrodes and the second buried electrodes are formed by polysilicon or metal silicon.

12. The device according to claim 1, further comprising a substrate on which external electrodes are formed;
 wherein the three-dimensional semiconductor integrated circuit device is electrically connected to the substrate by flip chip connection.

13. The device according to claim 1, further comprising a substrate on which external electrodes are formed;
 wherein the three-dimensional semiconductor integrated circuit device is electrically connected to the substrate by wire bonding.

14. The device according to claim 1, further comprising external electrodes formed on a surface of the second semiconductor chip or another of the semiconductor chips stacked on or over the second semiconductor chip opposite to the base;

wherein the three-dimensional semiconductor integrated circuit device is electrically connected to the external electrodes.

15. The device according to claim 1, further comprising a heat spreader attached to a surface of the base opposite to the first semiconductor chip.

16. The device according to claim 1, further comprising an electromagnetic shielding material that covers whole side faces of the first filling material and the second filling material.

17. A three-dimensional semiconductor integrated circuit device comprising:
  (a) a base;
  (b) a first semiconductor chip stacked on the base, wherein the first semiconductor chip includes a first solid-state circuit and is smaller than the base;
  (c) a first filling material that buries the first semiconductor chip, wherein the first filling material is formed to have approximately the same outside shape as the base;
  (d) first buried electrodes formed in the first semiconductor chip, wherein the first buried electrodes penetrate through the first semiconductor chip partially or entirely along a thickness direction of the first semiconductor chip;
  (e) a second semiconductor chip stacked on the first semiconductor chip to be superposed thereon, wherein the second semiconductor chip includes a second solid-state circuit and is smaller than the base;
  (f) a second filling material that buries the second semiconductor chip, wherein the second filling material is formed to have approximately the same outside shape as the base; and
  (g) second buried electrodes formed in the second semiconductor chip, wherein the second buried electrodes penetrate through the second semiconductor chip partially or entirely along a thickness direction of the second semiconductor chip;
  wherein the first filling material has a processibility required for forming the first buried electrodes equivalent to that of the first semiconductor chip and a thermal expansion coefficient equivalent to that of the first semiconductor chip; and
  wherein the second filling material has a processibility required for forming the second buried electrodes equivalent to that of the second semiconductor chip and a thermal expansion coefficient equivalent to that of the second semiconductor chip, and the base comprises an additional solid-state circuit, wherein the first solid-state circuit of the first semiconductor chip is placed opposite to the additional solid-state circuit.

18. A three-dimensional semiconductor integrated circuit device comprising:
  (a) a base;
  (b) a first semiconductor chip stacked on the base, wherein the first semiconductor chip includes a first solid-state circuit and is smaller than the base;
  (c) a first filling material that buries the first semiconductor chip, wherein the first filling material is formed to have approximately the same outside shape as the base;
  (d) first buried electrodes, formed in the first semiconductor chip, wherein the first buried electrodes penetrate through the first semiconductor chip partially or entirely along a thickness direction of the first semiconductor chip;
  (e) a second semiconductor chip stacked on the first semiconductor chip to be superposed thereon, wherein the second semiconductor chip includes a second solid-state circuit and is smaller than the base;
  (f) a second filling material that buries the second semiconductor chip, wherein the second filling material is formed to have approximately the same outside shape as the base;
  (g) second buried electrodes formed in the second semiconductor chip; and
  (h) a heat spreader attached to a surface of the base opposite to the first semiconductor chip;
  wherein the second buried electrodes penetrate through the second semiconductor chip partially or entirely along a thickness direction of the second semiconductor chip, wherein the first filling material has a processibility required for forming the first buried electrodes equivalent to that of the first semiconductor chip and a thermal expansion coefficient equivalent to that of the first semiconductor chip; and
  wherein the second filling material has a processibility required for forming the second buried electrodes equivalent to that of the second semiconductor chip and a thermal expansion coefficient equivalent to that of the second semiconductor chip.

19. A three-dimensional semiconductor integrated circuit device comprising:
  (a) a base;
  (b) a first semiconductor chip stacked on the base, wherein the first semiconductor chip includes a first solid-state circuit and is smaller than the base;
  (c) a first filling material that buries the first semiconductor chip, wherein the first filling material is formed to have approximately the same outside shape as the base;
  (d) first buried electrodes formed in the first semiconductor chip, wherein the first buried electrodes penetrate through the first semiconductor chip partially or entirely along a thickness direction of the first semiconductor chip;
  (e) a second semiconductor chip stacked on the first semiconductor chip to be superposed thereon, wherein the second semiconductor chip includes a second solid-state circuit and is smaller than the base;
  (f) a second filling material that buries the second semiconductor chip, wherein the second filling material is formed to have approximately the same outside shape as the base;
  (g) second buried electrodes formed in the second semiconductor chip, wherein the second buried electrodes penetrate through the second semiconductor chip partially or entirely along a thickness direction of the second semiconductor chip; and
  (h) an electromagnetic shielding material that covers whole side faces of the first filling material and the second filling material;
  wherein the first filling material has a processibility required for forming the first buried electrodes equivalent to that of the first semiconductor chip and a thermal expansion coefficient equivalent to that of the first semiconductor chip; and
  wherein the second filling material has a processibility required for forming the second buried electrodes equivalent to that of the second semiconductor chip and a thermal expansion coefficient equivalent to that of the second semiconductor chip.

20. The device according to claim 1, wherein the first circuit layer constitutes a single semiconductor chip made entirely of a third material to thereby set necessary processing conditions, and wherein the second circuit layer constitutes a single semiconductor chip made entirely of a fourth material to thereby set necessary processing conditions.

* * * * *